(12) United States Patent
Wang et al.

(10) Patent No.: US 12,538,673 B2
(45) Date of Patent: Jan. 27, 2026

(54) DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xinxin Wang, Beijing (CN); Bo Zhang, Beijing (CN); Zhiwen Chu, Beijing (CN); Yi Qu, Beijing (CN); Aoyuan Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 427 days.

(21) Appl. No.: 18/040,427

(22) PCT Filed: Feb. 18, 2022

(86) PCT No.: PCT/CN2022/076859
§ 371 (c)(1),
(2) Date: Feb. 3, 2023

(87) PCT Pub. No.: WO2023/155140
PCT Pub. Date: Aug. 24, 2023

(65) Prior Publication Data
US 2024/0276803 A1   Aug. 15, 2024

(51) Int. Cl.
*H10K 59/131* (2023.01)

(52) U.S. Cl.
CPC ................ *H10K 59/131* (2023.02)

(58) Field of Classification Search
CPC .... H10K 59/131; H10K 59/00; H10K 77/111; G02F 1/1343
See application file for complete search history.

(56) References Cited

U.S. PATENT DOCUMENTS 12,035,587 B2 * 7/2024 Jiang ................ G02F 1/1345
12,035,589 B2 * 7/2024 Zheng ................ H10K 59/40
(Continued)

FOREIGN PATENT DOCUMENTS

CN          1928676 A      3/2007
CN       103337233 B       3/2016
(Continued)

*Primary Examiner* — J. E. Schoenholtz
(74) *Attorney, Agent, or Firm* — Dority & Manning, PA

(57) ABSTRACT

A display panel includes a display area, a first fan-out region, a bending region and fan-out traces disposed in the first fan-out region. The fan-out trace includes a lead-out segment and an extension segment that are connected. The fan-out traces include a first trace group and a second trace group that are not symmetrically. The first trace group includes first trace bundles. A first trace bundle closest to the second trace group includes a first sub-bundle and a second sub-bundle, each of which includes a lead-out portion and an extension portion that are connected. The lead-out portion and the extension portion are constituted by lead-out segments and extension segments of fan-out traces in a corresponding sub-bundle, respectively. A distance between the extension portion of the first sub-bundle and the extension portion of the second sub-bundle is greater than a distance between two adjacent fan-out traces in any first trace bundle.

20 Claims, 14 Drawing Sheets

(56) References Cited

U.S. PATENT DOCUMENTS

| | | | |
|---|---|---|---|
| 2007/0195254 A1* | 8/2007 | Lee | G02F 1/1345 349/149 |
| 2009/0262292 A1 | 10/2009 | Lee | |
| 2012/0169578 A1 | 7/2012 | Kim et al. | |
| 2021/0234079 A1 | 7/2021 | Han | |
| 2021/0376039 A1* | 12/2021 | Jo | H10K 77/111 |
| 2022/0216290 A1* | 7/2022 | Zheng | H10K 59/40 |
| 2022/0310767 A1* | 9/2022 | Park | H10K 77/111 |
| 2022/0344449 A1* | 10/2022 | Jiang | G02F 1/1345 |
| 2023/0134900 A1 | 5/2023 | Fan et al. | |

FOREIGN PATENT DOCUMENTS

| | | |
|---|---|---|
| CN | 109634003 A | 4/2019 |
| CN | 110289287 A | 9/2019 |
| CN | 210805177 U | 6/2020 |
| CN | 111564111 A | 8/2020 |
| CN | 112071209 A | 12/2020 |
| CN | 112349714 A | 2/2021 |
| CN | 215451419 U | 1/2022 |

\* cited by examiner

DISPLAY PANEL AND DISPLAY APPARATUS

CROSS-REFERENCE TO RELATED APPLICATION

This application is a national phase entry under 35 USC 371 of International Patent Application No. PCT/CN2022/076859 filed on Feb. 18, 2022, which is incorporated herein by reference in its entirety.

TECHNICAL FIELD

The present disclosure relates to the field of display technologies, and in particular, to a display panel and a display apparatus.

BACKGROUND

With the continuous development of the display technology, an organic light-emitting diode (OLED) display apparatus provides possibility for diversity of appearance of products (e.g., a curved display apparatus and a foldable display apparatus) due to bendable properties of its material and structure.

SUMMARY

In an aspect, a display panel is provided. The display panel has a display area, a first fan-out region, and a bending region that are sequentially disposed in a first direction.

The display panel includes a plurality of fan-out traces disposed in the first fan-out region, the plurality of fan-out traces extend from a side of the first fan-out region proximate to the display area to a side of the first fan-out region proximate to the bending region; a fan-out trace in the plurality of fan-out traces includes a lead-out segment and an extension segment that are connected, and the lead-out segment is closer to the display area than the extension segment. The plurality of fan-out traces are divided into a first trace group and a second trace group that are disposed in parallel in a second direction, and the first trace group and the second trace group are asymmetrically arranged; the first direction and the second direction intersect.

The first trace group includes a plurality of first trace bundles that are disposed in parallel in the second direction; a first trace bundle, closest to the second trace group, in the plurality of first trace bundles includes a first sub-bundle and a second sub-bundle, and the second sub-bundle is closer to the second trace group than the first sub-bundle. The first sub-bundle and the second sub-bundle each include a lead-out portion and an extension portion that are connected, the lead-out portion is constituted by lead-out segments of fan-out traces in a corresponding sub-bundle, and the extension portion is constituted by extension segments of the fan-out traces in the corresponding sub-bundle; in the second direction, a distance between the extension portion of the first sub-bundle and the extension portion of the second sub-bundle is greater than a distance between two adjacent fan-out traces in any first trace bundle in the plurality of first trace bundles.

In some embodiments, the second sub-bundle includes a first trace cluster and a second trace cluster that are disposed in parallel in the second direction, and the second trace cluster is closer to the second trace group than the first trace cluster. In a direction directed from the first trace group to the second trace group in the second direction, linear lengths of fan-out traces in the second trace cluster gradually increase; a linear length of the fan-out trace is a sum of a linear distance between two ends of the lead-out segment of the fan-out trace and a linear distance between two ends of the extension segment of the fan-out trace. At least one fan-out trace in the second trace cluster each has a first curved portion; and/or at least one fan-out trace in the second trace cluster each has a widened portion, and in the second direction, a line width of the widened portion is greater than a line width of another portion of a corresponding fan-out trace except the widened portion.

In some embodiments, the second trace cluster includes a first sub-cluster and a second sub-cluster that are disposed in parallel in the second direction, and the second sub-cluster is closer to the second trace group than the first sub-cluster. Fan-out traces in the first sub-cluster each have the first curved portion; and/or fan-out traces in the second sub-cluster each have the widened portion.

In some embodiments, in the direction directed from the first trace group to the second trace group in the second direction, linear lengths of first curved portions of the fan-out traces in the first sub-cluster gradually decrease; and/or in the direction directed from the first trace group to the second trace group in the second direction, linear lengths of widened portions of the fan-out traces in the second sub-cluster gradually increase.

In some embodiments, in the direction directed from the first trace group to the second trace group in the second direction, linear lengths of fan-out traces in the first trace cluster gradually decrease. At least one fan-out trace in the first trace cluster each has a second curved portion.

In some embodiments, fan-out traces in the first trace cluster each have the second curved portion. In the direction directed from the first trace group to the second trace group in the second direction, linear lengths of second curved portions of the fan-out traces in the first trace cluster gradually increase.

In some embodiments, the first curved portion is arranged in an extension segment of a corresponding fan-out trace; and/or, in the second direction, a line width of the first curved portion is substantially equal to a line width of another portion of the corresponding fan-out trace except the first curved portion.

In some embodiments, the widened portion is arranged in an extension segment of a corresponding fan-out trace; and/or, the widened portion is arranged in a linear manner.

In some embodiments, the display panel further has a second fan-out region located on a side of the bending region away from the first fan-out region. The display panel further includes a plurality of first connection lines disposed in the second fan-out region, the plurality of first connection lines extend from a side of the second fan-out region proximate to the bending region to a side of the second fan-out region away from the bending region, and a first connection line in the plurality of first connection lines is electrically connected to the fan-out trace. In the second direction, a distance exists between first connection lines connected to the first sub-bundle and first connection lines connected to the second sub-bundle. In a direction directed from the side of the second fan-out region proximate to the bending region to the side of the second fan-out region away from the bending region, the first connection lines connected to the second sub-bundle gradually approach the first connection lines connected to the first sub-bundle.

In some embodiments, the display panel further has a second fan-out region located on a side of the bending region away from the first fan-out region. The display panel further includes a plurality of first connection lines disposed at least in the second fan-out region, the plurality of first connection lines extend from a side of the second fan-out region proximate to the bending region to a side of the second fan-out region away from the bending region, and a first connection line in the plurality of first connection lines is electrically connected to the fan-out trace.

In a direction directed from the first trace group to the second trace group in the second direction, a first trace bundle, farthest away from the second trace group, in the plurality of first trace bundles is a target first trace bundle, and linear lengths of fan-out traces in the target first trace bundle gradually decrease; the target first trace bundle includes a third sub-bundle and a fourth sub-bundle, and the third sub-bundle is farther away from the second trace group than the fourth sub-bundle.

In the plurality of first connection lines, first connection lines that are connected to fan-out traces in the third sub-bundle constitute a fifth sub-bundle, and an extension length of a first connection line in the fifth sub-bundle is greater than a linear length of the first connection line; the extension length of the first connection line is a length of an extension path of the first connection line, and the linear length of the first connection line is a linear distance between two ends of the first connection line. At least one first connection line in the fifth sub-bundle each has a polyline portion, the polyline portion includes a plurality of segments connected in sequence, and not all of the plurality of segments extend in same directions; and/or at least one first connection line in the fifth sub-bundle each has a third curved portion.

In some embodiments, the fifth sub-bundle includes a first connection line cluster and a second connection line cluster that are disposed in parallel in the second direction, and the first connection line cluster is farther away from the second trace group than the second connection line cluster. The polyline portion includes a first polyline portion. First connection lines in the first connection line cluster and first connection lines in the second connection line cluster each have the first polyline portion. The first connection lines in the first connection line cluster each further have the third curved portion.

In some embodiments, the display panel further includes a test circuit disposed on the side of the second fan-out region away from the bending region, and the first polyline portion is located on a side of the test circuit in the second direction. The first polyline portion includes a first polyline segment, a second polyline segment and a third polyline segment that are connected in sequence, the first polyline segment and the third polyline segment substantially extend in the first direction, and the second polyline segment substantially extends in the second direction. The first polyline segment is farther away from the second trace group than the third polyline segment; the first polyline segment is electrically connected to a corresponding fan-out trace, and the third polyline segment is electrically connected to the test circuit. A first polyline portion in the first connection line cluster at least partially surrounds a first polyline portion in the second connection line cluster.

In some embodiments, in the direction directed from the first trace group to the second trace group in the second direction, linear lengths of first polyline portions of the first connection lines in the first connection line cluster and first polyline portions of the first connection lines in the second connection line cluster gradually decrease, a linear length of the first polyline portion being a sum of linear distances between two ends of each segment of the first polyline portion; and/or, in the direction directed from the first trace group to the second trace group in the second direction, linear lengths of third curved portions of the first connection lines in the first connection line cluster gradually decrease.

In some embodiments, the fifth sub-bundle further includes a third connection line cluster and a fourth connection line cluster that are disposed in parallel in the second direction, and the third connection line cluster is farther away from the second trace group than the fourth connection line cluster; the third connection line cluster and the fourth connection line cluster are closer to the second trace group than the first connection line cluster and the second connection line cluster. The polyline portion further includes a second polyline portion. First connection lines in the third connection line cluster and first connection lines in the fourth connection line cluster each have the second polyline portion. The first connection lines in the third connection line cluster each further have the third curved portion.

In some embodiments, the display panel further includes a test circuit disposed on the side of the second fan-out region away from the bending region, and the second polyline portion is located on a side of the test circuit proximate to the second fan-out region. The second polyline portion includes a fourth polyline segment and a fifth polyline segment that are connected in sequence, the fourth polyline segment substantially extends in the first direction, and the fifth polyline segment substantially extends in the second direction. The fourth polyline segment is electrically connected to a corresponding fan-out trace in the plurality of fan-out traces, and the fifth polyline segment is electrically connected to the test circuit. A second polyline portion in the third connection line cluster at least partially surrounds a second polyline portion in the fourth connection line cluster.

In some embodiments, in the direction directed from the first trace group to the second trace group in the second direction, linear lengths of second polyline portions of the first connection lines in the third connection line cluster and second polyline portions of the first connection lines in the fourth connection line cluster gradually decrease, a linear length of the second polyline portion being a sum of linear distances between two ends of each segment of the second polyline portion; and/or in the direction directed from the first trace group to the second trace group in the second direction, linear lengths of third curved portions of the first connection lines in the third connection line cluster gradually decrease.

In some embodiments, in the direction directed from the first trace group to the second trace group in the second direction, extension lengths of first connection lines in the first connection line cluster, the second connection line cluster, the third connection line cluster and the fourth connection line cluster gradually decrease.

In some embodiments, in the plurality of first connection lines, first connection lines that are connected to fan-out traces in the fourth sub-bundle constitute a sixth sub-bundle, and an extension length of each first connection line in the sixth sub-bundle is substantially equal to a linear length thereof.

In some embodiments, in a direction directed from the first trace group to the second trace group in the second direction, linear lengths of fan-out traces in a first trace bundle in two adjacent first trace bundles gradually decrease. At least one fan-out trace in a first trace bundle that is farther away from the second trace group in the two adjacent first trace bundles has a curved portion; and in the first trace bundle, the fan-out trace having the curved portion is closer to the second trace group than other fan-out traces.

In some embodiments, the second trace group includes a plurality of second trace bundles disposed in parallel in the second direction. In a direction directed from the second trace group to the first trace group in the second direction, linear lengths of fan-out traces in a second trace bundle in two adjacent second trace bundles gradually decrease. At least one fan-out trace in a second trace bundle that is farther away from the first trace group in the two adjacent second trace bundles has a curved portion; and in the second trace bundle, the fan-out trace having the curved portion is closer to the first trace group than other fan-out traces.

In some embodiments, the display panel further has a second fan-out region located on a side of the bending region away from the first fan-out region; the display panel further includes a plurality of first connection lines disposed at least in the second fan-out region, and the plurality of first connection lines extend from a side of the second fan-out region proximate to the bending region to a side of the second fan-out region away from the bending region. The display panel further includes a plurality of second connection lines disposed in the bending region, and the plurality of second connection lines extend from a side of the bending region proximate to the first fan-out region to a side of the bending region proximate to the second fan-out region. The fan-out trace, a second connection line in the plurality of second connection lines and a first connection line in the plurality of first connection lines are electrically connected in sequence.

In another aspect, a display apparatus is provided. The display apparatus includes the first display panel. The first display panel is the display panel described in any one of the above embodiments.

In some embodiments, the display apparatus further includes a second display panel and a rotating shaft. The rotating shaft is disposed on a back side of the second display panel, the second display panel being able to be folded along the rotating shaft. The first display panel is disposed on the back side of the second display panel, and is located on a side of the rotating shaft; a light-emitting direction of the first display panel and a light-emitting direction of the second display panel are opposite to each other.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1A:
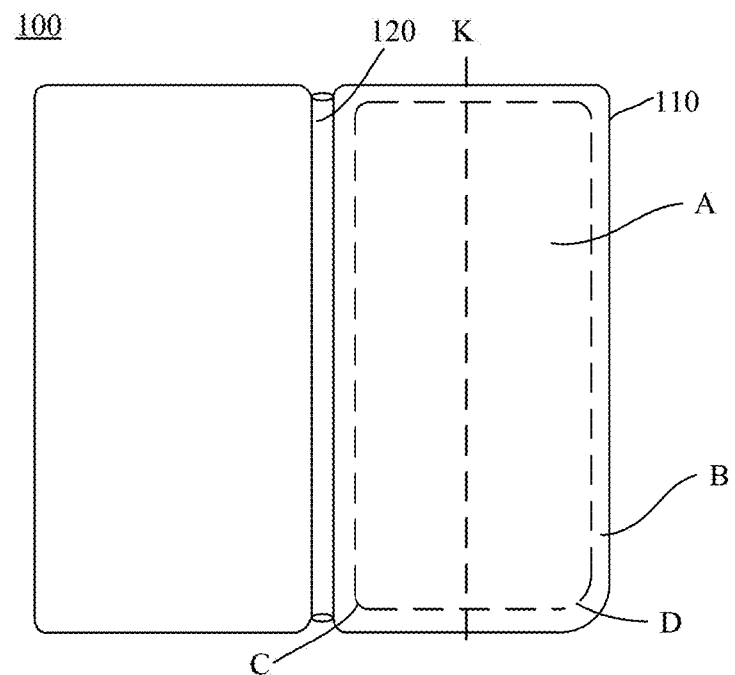
FIG. 1A is a structural diagram of a display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term such as "about", "substantially" or "approximately" includes a stated value and an average value within an acceptable range of deviation of a particular value. The acceptable range of deviation is determined by a person of ordinary skill in the art in view of the measurement in question and errors associated with the measurement of a particular quantity (i.e., the limitation of the measurement system).

As used herein, the term such as "parallel", "perpendicular", or "equal" includes a stated condition and a condition similar to the stated condition. A range of the similar condition is in an acceptable range of deviation, and the acceptable range of deviation is determined by a person of ordinary skill in the art in view of measurement in question and errors associated with the measurement of a particular quantity (i.e., the limitation of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals being less than or equal to 5% of any one of the two equals.

As used herein, the term "substantially" includes a stated value and an average value within an acceptable range of deviation of a particular value. The acceptable range of deviation is determined by a person of ordinary skill in the art in view of the measurement in question and errors associated with the measurement of a particular quantity (i.e., the limitation of the measurement system).

Exemplary embodiments are described herein with reference to sectional views and/or plan views as idealized exemplary drawings. In the drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a display panel and a display apparatus. The display apparatus will be introduced below.

Figure 1B:
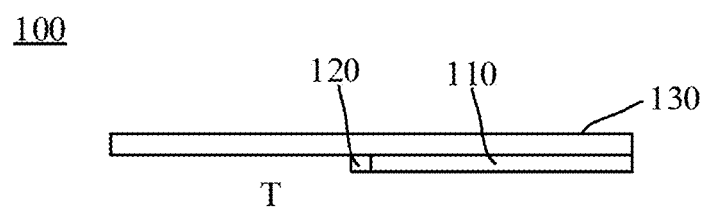
FIG. 1B is another structural diagram of a display apparatus, in accordance with some embodiments.

As shown in FIGS. 1A and 1B, some embodiments of the present disclosure provide the display apparatus 100. The display apparatus 100 may be any apparatus that displays an image whether in motion (e.g., a video) or stationary (e.g., a still image), and whether literal or graphical. More specifically, it is anticipated that the described embodiments may be implemented in or associated with a variety of electronic devices. The variety of electronic devices include (but are not limited to), for example, mobile telephones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, automobile displays (e.g., odometer displays), navigators, cockpit controllers and/or displays, camera view displays (e.g., rear view camera displays in a vehicle), electronic photos, electronic billboards or signages, projectors, architectural structures, packaging and aesthetic structures (e.g., displays for displaying images of a piece of jewelry).

In addition, if classified according to whether the display apparatus 100 can be folded, the display apparatus 100 may be a foldable display apparatus or a common display apparatus (which may be referred to as a flat display apparatus).

For example, as shown in FIGS. 1A and 1B, the display apparatus 100 is the foldable display apparatus. The foldable display apparatus includes a first display panel 110, a second display panel 130 and a rotating shaft 120. The first display panel 110 is disposed on a back side T of the second display panel 130 and is located on a side of the rotating shaft 120. The rotating shaft 120 is disposed on the back side T of the second display panel 130, and the second display panel 130 is able to be folded along the rotating shaft 120. Light-emitting directions of the first display panel 110 and the second display panel 130 are opposite to each other.

In addition, in order to facilitate the bending of the foldable display apparatus and avoid a rotating assembly (including the rotating shaft 120) of the foldable display apparatus, structures of two sides, close to and away from the rotating assembly, of the first display panel 110 may be asymmetrically arranged.

Embodiments of the present disclosure will be schematically described below by considering an example in which the display apparatus 100 is the foldable display apparatus.

The first display panel 110 and the second display panel may be organic light-emitting diode (OLED) display panels, quantum dot light-emitting diode (QLED) display panels, or the like, which is not specifically limited in the embodiments of the present disclosure.

Embodiments of the present disclosure will be schematic described below by considering the first display panel 110 as an example.

Figure 2:
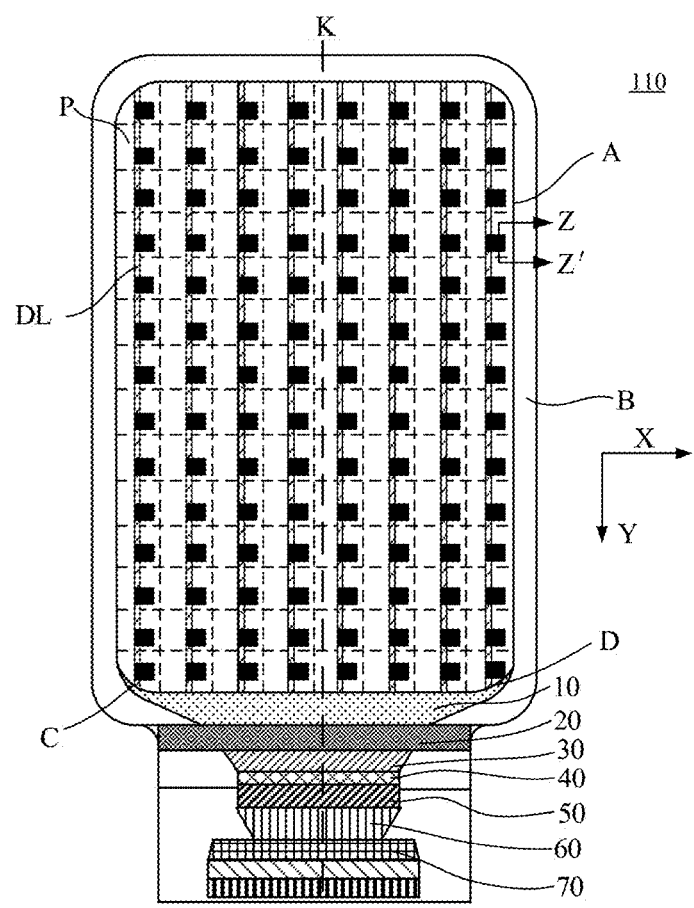
FIG. 2 is a top structural view of a display panel, in accordance with some embodiments.

In some embodiments, as shown in FIG. 2, the first display panel 110 has a display area A and a peripheral area B located on at least one side of the display area A. FIG. 2 illustrates an example in which the peripheral area B surrounds the display area A.

Figure 3:
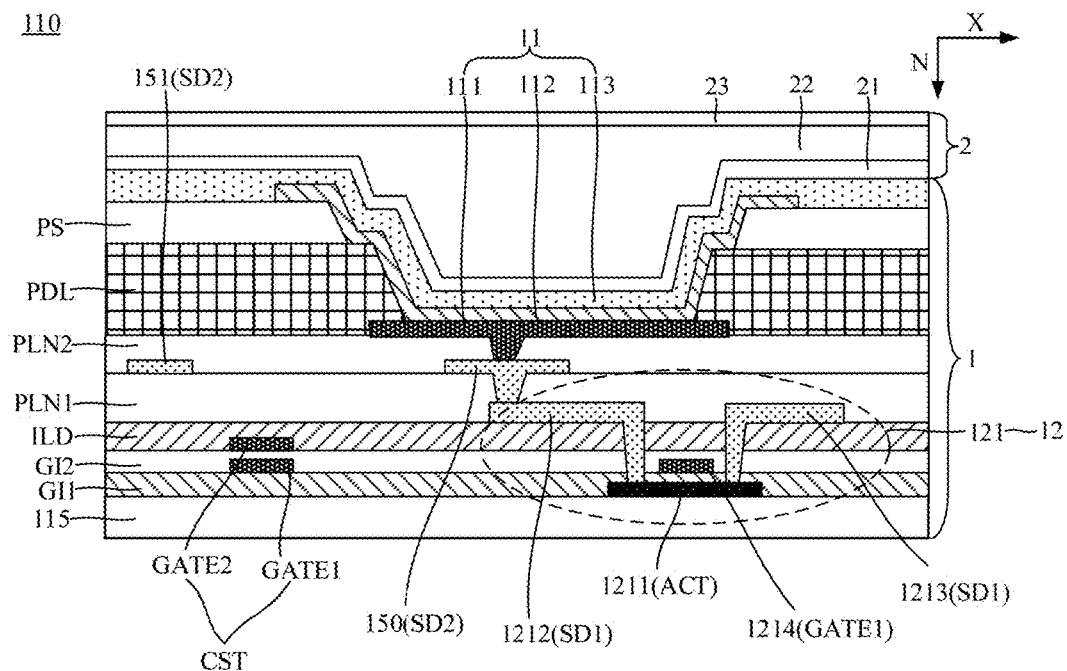
FIG. 3 is a sectional view of the display panel shown in FIG. 2 taken along the section line Z-Z'.

In some embodiments, as shown in FIG. 3, the first display panel 110 includes a display substrate 1 and an encapsulation layer 2 for encapsulating the display substrate 1.

Here, the encapsulation layer 2 may be an encapsulation film, or an encapsulation substrate. In some embodiments, as shown in FIG. 3, the encapsulation layer 2 includes a first inorganic film 21, an organic film 22 and a second inorganic film 23, which prevents water vapor and oxygen in an external environment from entering the first display panel 110 and damaging organic materials in light-emitting devices 11, so as to avoid shortening the service life of the first display panel 110.

Here, in the case where the structures of two sides, close to and away from the rotating assembly, of the first display panel 110 are asymmetrically arranged, structures of two sides, close to and away from the rotating assembly, of the display area A of the first display panel 110 are also asymmetrically arranged (as shown in FIGS. 1A and 2, a reference line K is taken as a symmetrical line, the reference line K being a straight line in a first direction Y and passing through the display area A; the structure of the display area A of the first display panel 110 is asymmetrical with respect to the reference line K; the display area A substantially has a shape of a rectangle, a hexagon, a circle or an irregular polygon, and the embodiments of the present disclosure are not limited thereto). For example, as shown in FIGS. 1A and 2, the display area A of the first display panel 110 substantially has the shape of the rectangle. Two corners of the display area A close to a first fan-out region 10 are arc-shaped corners, and the two corners are a first corner C and a second corner D. A radian of the first corner C is less than a radian of the second corner D. It will be noted that centers of circles corresponding to the arc-shaped corners are in the first display panel 110.

The display area A is a region for displaying images, and the display area A is configured to be provided therein with sub-pixels P.

For example, as shown in FIGS. 2 and 3, the first display panel 110 includes a plurality of sub-pixels P disposed on a side of a substrate 115 and located in the display area A. The plurality sub-pixels P are arranged in multiple rows and columns, each row of sub-pixels P may include sub-pixels P arranged in a second direction X, and each column of sub-pixels P may include sub-pixels P arranged in the first direction Y.

Here, the first direction Y and the second direction X intersect each other. An included angle between the first direction Y and the second direction X may be set according to actual needs. For example, the included angle between the first direction Y and the second direction X may be 85°, 87°, 89°, 90°, 91° or 92°.

In some embodiments, as shown in FIGS. 2 and 3, the first display panel 110 may further include a plurality of data connection lines DL and a plurality of gate connection lines (not shown in FIG. 2). The plurality of gate connection lines extend in the second direction X, and the plurality of data connection lines DL extend in the first direction Y. Sub-pixels P in a same row may be electrically connected to a gate connection line, and sub-pixels P in a same column may be electrically connected to a data connection line DL. Here, the gate connection line and the data connection line DL are electrically connected to a pixel driving circuit of the sub-pixel P.

In some embodiments, as shown in FIGS. 2 and 3, each sub-pixel P includes a light-emitting device 11 and a pixel driving circuit 12 that are disposed on the substrate 115. The pixel driving circuit 12 includes a plurality of thin film transistors 121. The thin film transistor 121 includes an active layer 1211, a source 1212, a drain 1213 and a gate 1214, and the source 1212 and the drain 1213 are in contact with the active layer 1211. In a direction parallel to a thickness direction N of the substrate 115 and away from the substrate 115, the light-emitting device 11 includes a first electrode layer 111, a light-emitting functional layer 112 and a second electrode layer 113 that are disposed in sequence, and the first electrode layer 111 is electrically connected to the source 1212 or the drain 1213 of a thin film transistor that serves as a driving transistor in the plurality of thin film transistors 121. FIG. 3 illustrates an example in which the first electrode layer 111 is electrically connected to the source 1212 of the thin film transistor 121.

It will be noted that the source 1212 and drain 1213 may be interchangeable. That is, the mark number 1212 in FIG. 3 represents the drain, and the mark number 1213 in FIG. 3 represents the source.

In some embodiments, the light-emitting functional layer 112 includes only a light-emitting layer. In some other embodiments, in addition to the light-emitting layer, the light-emitting functional layer 112 further includes at least one of an electron transport layer (ETL), an electron injection layer (EIL), a hole transport layer (HTL) and a hole injection layer (HIL).

In some embodiments, as shown in FIG. 3, the display substrate 1 includes a pixel defining layer PDL, the pixel defining layer PDL has a plurality of opening regions, and a light-emitting device 11 is arranged in an opening region.

In some embodiments, as shown in FIG. 3, the display substrate 1 further includes a spacer PS disposed between the pixel defining layer PDL and light-emitting functional layers 112.

In some embodiments, as shown in FIG. 3, the display substrate 1 further includes a semiconductor layer ACT, a first gate insulating layer GI1, a first gate conductive layer GATE1, a second gate insulating layer GI2, a second gate conductive layer GATE2, an interlayer insulating layer ILD, a first source-drain conductive layer SD1, a first planarization layer PLN1, a second source-drain conductive layer SD2 and a second planarization layer PLN2.

As shown in FIG. 3, the semiconductor layer ACT, the first gate insulating layer GI1, the first gate conductive layer GATE1, the second gate insulating layer GI2, the second gate conductive layer GATE2, the interlayer insulating layer ILD, the first source-drain conductive layer SD1 and the second source-drain conductive layer SD2 are sequentially disposed between the substrate 115 and first electrode layers 111.

A material of the semiconductor layer ACT includes amorphous silicon, monocrystalline silicon, polycrystalline silicon or a metal oxide semiconductor material. For example, the material of the semiconductor layer ACT includes indium gallium zinc oxide (IGZO) or zinc oxide (ZnO), and the embodiments of the present disclosure are not limited thereto. The semiconductor layer includes the active layers 1211 of the thin film transistors 121.

The first gate conductive layer GATE1 overlaps with the semiconductor layer ACT to form the thin film transistors 121. A material of the first gate conductive layer GATE1 includes conductive metal. For example, the material of the first gate conductive layer GATE1 includes at least one of aluminum, copper and molybdenum, and the embodiments of the present disclosure are not limited thereto. The first gate conductive layer GATE1 includes gates 1214 of the thin film transistors 121 and first electrode plates of capacitors CST.

The first gate insulating layer GI1 is disposed between the semiconductor layer ACT and the first gate conductive layer GATE1, and is used to electrically insulate the semiconductor layer ACT from the first gate conductive layer GATE1. A material of the first gate insulating layer GI1 includes any one of inorganic insulating materials of silicon nitride, silicon oxynitride and silicon oxide. For example, the material of the first gate insulating layer GI1 includes silicon dioxide, and the embodiments of the present disclosure are not limited thereto.

The second gate conductive layer GATE2 overlaps with the first gate conductive layer GATE1 to form the capacitors CST. A material of the second gate conductive layer GATE2 includes conductive metal. For example, the material of the second gate conductive layer GATE2 includes at least one of aluminum, copper and molybdenum, and the embodiments of the present disclosure are not limited thereto. The second gate conductive layer GATE2 includes second electrode plates of the capacitors CST.

The second gate insulating layer GI2 is disposed between the first gate conductive layer GATE1 and the second gate conductive layer GATE2, and is used to electrically insulate the first gate conductive layer GATE1 from the second gate conductive layer GATE2. A material of the second gate insulating layer GI2 includes any one of inorganic insulating materials of silicon nitride, silicon oxynitride and silicon oxide. For example, the material of the second gate insulating layer GI2 includes silicon dioxide, and the embodiments of the present disclosure are not limited thereto.

An interlayer insulating layer ILD is disposed between the first source-drain conductive layer SD1 and the second gate conductive layer GATE2, and is used to electrically insulate the first source-drain conductive layer SD1 from the second gate conductive layer GATE2. A material of the interlayer insulating layer ILD includes any one of inorganic insulating materials of silicon nitride, silicon oxynitride and silicon oxide. For example, the material of the second gate insulating layer GI2 includes silicon dioxide, and the embodiments of the present disclosure are not limited thereto.

The first source-drain conductive layer SD1 is disposed between the interlayer insulating layer ILD and the first planarization layer PLN1. The first source-drain conductive layer SD1 includes conductive metal. For example, a material of the first source-drain conductive layer SD1 includes at least one of aluminum, copper and molybdenum, and the embodiments of the present disclosure are not limited thereto. The first source-drain conductive layer SD1 includes sources 1212 and drains 1213 of the thin film transistors 121.

The first planarization layer PLN1 is disposed between the first source-drain conductive layer SD1 and the second source-drain conductive layer SD2, and is used to electrically insulate the first source-drain conductive layer SD1 from the second source-drain conductive layer SD2. A material of the first planarization layer PLN1 includes any one of inorganic insulating materials of silicon nitride, silicon oxynitride and silicon oxide. For example, the material of the first planarization layer PLN1 includes silicon dioxide, and the embodiments of the present disclosure are not limited thereto.

The second source-drain conductive layer SD2 is disposed between the first planarization layer PLN1 and the second planarization layer PLN2. The second source-drain conductive layer SD2 includes conductive metal. For example, a material of the second source-drain conductive layer SD2 includes at least one of aluminum, copper and molybdenum, and the embodiments of the present disclosure are not limited thereto. The second source-drain conductive layer SD2 includes at least one of connection electrodes 150, initialization signal lines 151 and auxiliary signal lines, and the embodiments of the present disclosure are not limited thereto.

The second planarization layer PLN2 is disposed between the second source-drain conductive layer SD2 and the first electrode layers 111, and is used to electrically insulate the second source-drain conductive layer SD2 from the first electrode layers 111. A material of the second planarization layer PLN2 includes any one of inorganic insulating materials of silicon nitride, silicon oxynitride and silicon oxide. For example, the material of the second planarization layer PLN2 includes silicon dioxide, and embodiments of the present disclosure are not limited thereto.

Referring to FIG. 2, the peripheral area B is a region in which no image is displayed, and the peripheral area B may be configured to be provided therein with scan driving circuit(s), circuit traces, bonding pins, etc.

Figure 4:
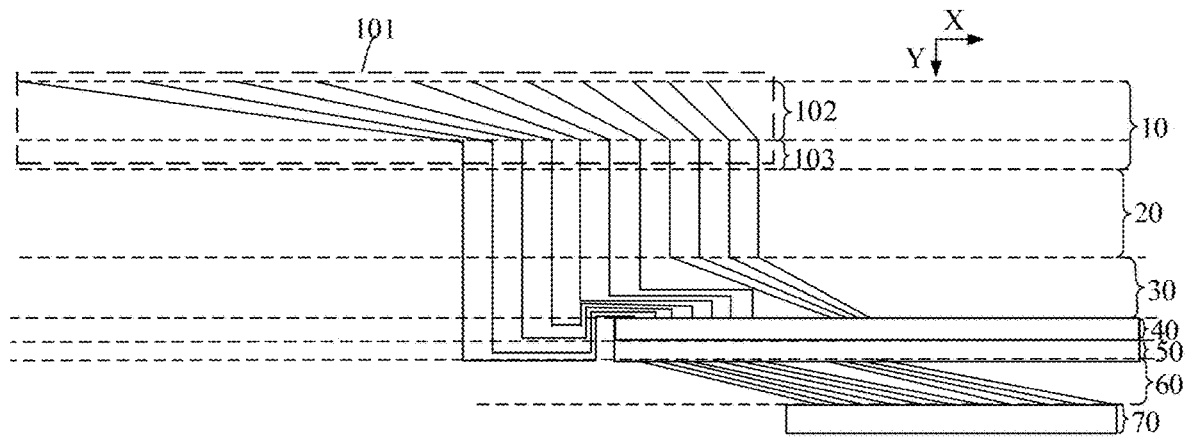
FIG. 4 is a partial structural diagram of a peripheral area B of a display panel, in accordance with some embodiments.

In some embodiments, as shown in FIGS. 2 and 4, the peripheral area B includes the first fan-out region 10, a bending region 20, a second fan-out region 30, an electrostatic protection region 40, a test region 50, a third fan-out region 60 and a bonding region 70 that are sequentially disposed in the first direction Y.

As shown in FIGS. 2 and 4, the first fan-out region 10 is provided therein with a plurality of fan-out traces 101, and each fan-out trace 101 extends from a side of the first fan-out region 10 proximate to the display area A to a side of the first fan-out region 10 proximate to the bending region 20. The fan-out trace 101 includes a lead-out segment 102 and an extension segment 103 connected to the lead-out segment 102, and the lead-out segment 102 is closer to the display area A than the extension segment 103.

Figure 5:
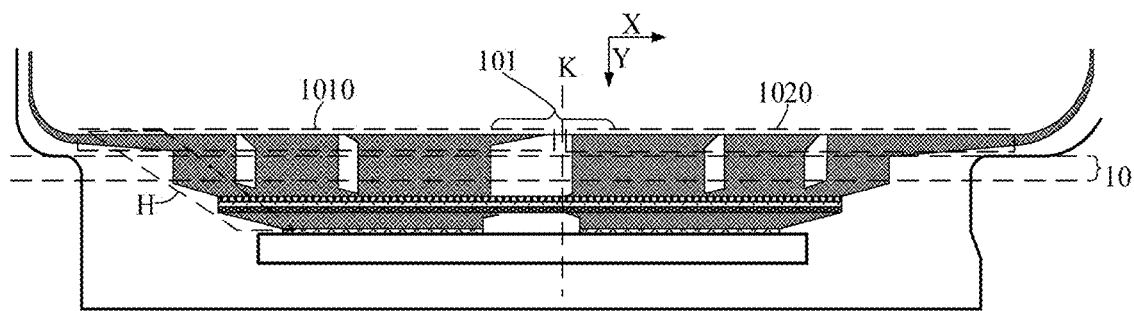
FIG. 5 is a structural diagram of a display panel, in accordance with some embodiments.

Based on this, as shown in FIG. 5, the plurality of fan-out traces 101 are divided into a first trace group 1010 and a second trace group 1020 that are disposed in parallel in the second direction X. The first trace group 1010 and the second trace group 1020 are located on two sides of the reference line K, respectively.

Figure 6A:
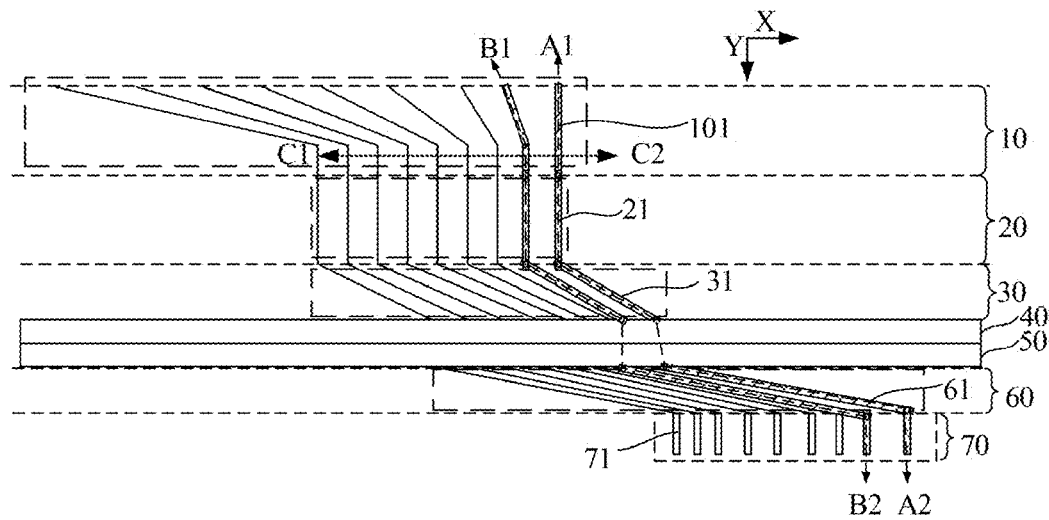
FIG. 6A is a partial enlarged view of the region H of the display panel in FIG. 5.

In addition, as shown in FIG. 6A, the plurality of fan-out traces 101 may be located in the first gate conductive layer GATE1 and/or the second gate conductive layer GATE2. For example, as shown in FIG. 6D, a part of the plurality of fan-out traces 101 is disposed in the first gate conductive layer GATE1, and another part of the plurality of fan-out traces 101 is disposed in the second gate conductive layer GATE2; orthographic projections of the fan-out traces 101 located in the first gate conductive layer GATE1 on the substrate 115 and orthographic projections of the fan-out traces 101 located in the second gate conductive layer GATE2 on the substrate 115 are at least partially staggered arranged, so that the parasitic capacitance between the fan-out traces 101 located in the first gate conductive layer GATE1 and the fan-out traces 101 located in the second gate conductive layer GATE2 is reduced.

As shown in FIG. 6A, in some embodiments, the bending region 20 is provided therein with a plurality of second connection lines 21, and each second connection line 21 extends from a side of the bending region 20 proximate to the first fan-out region 10 to a side of the bending region 20 proximate to the second fan-out region 30. A single fan-out trace 101 is electrically connected to a single second connection line 21.

Figure 6B:
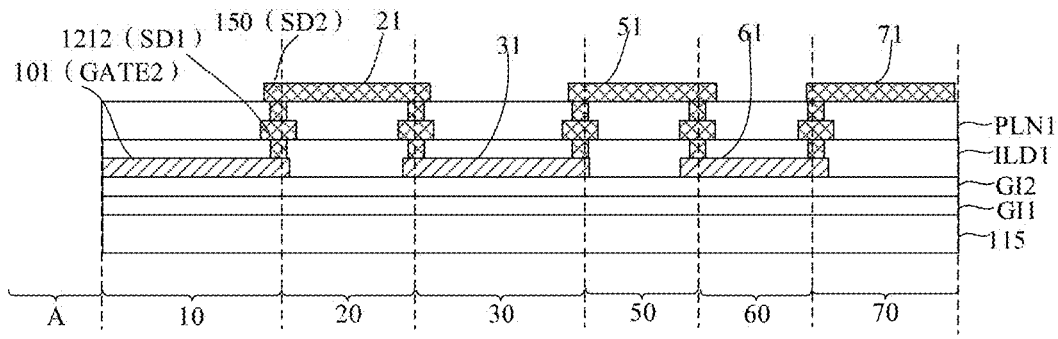
FIG. 6B is a sectional view of the display panel shown in FIG. 6A taken along the section line A1-A2.

As shown in FIG. 6B, the plurality of second connection lines 21 may be located in the second source-drain conductive layer SD2, so that the number of metal layers required for the bending region 20 is reduced. As a result, the bending region 20 has a higher flexibility.

Figure 6C:
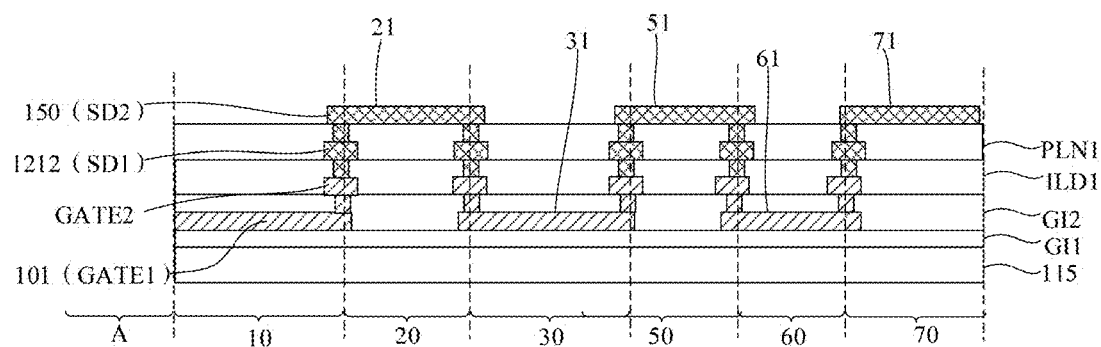
FIG. 6C is a sectional view of the display panel shown in FIG. 6A taken along the section line B1-B2.
Figure 6D:
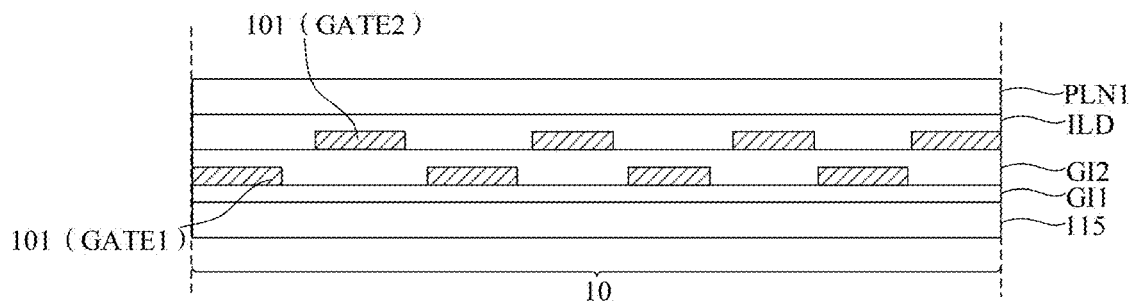
FIG. 6D is a sectional view of the display panel shown in FIG. 6A taken along the section line C1-C2.

As shown in FIG. 6B, the fan-out trace 101 located in the second gate conductive layer GATE2 is electrically connected to a second connection line 21, and may be electrically connected to the second connection line 21 through a transfer block located in the first source-drain conductive layer SD1. As shown in FIG. 6C, the fan-out trace 101 located in the first gate conductive layer GATE1 is electrically connected to a second connection line 21, and may be electrically connected to the second connection line 21 through a transfer block located in the second gate conductive layer GATE2 and a transfer block located in the first source-drain conductive layer SD1.

As shown in FIG. 6A, the second fan-out region 30 is provided therein with a plurality of first connection lines 31, and each first connection line 31 extends from a side of the second fan-out region 30 proximate to the bending region 20 to a side of the second fan-out region 30 away from the bending region 20. A single first connection line 31 is electrically connected to a single fan-out trace 101, and the fan-out trace 101, the second connection line 21 and the first connection line 31 are electrically connected in sequence.

Here, the first connection lines 31 may be located in the first gate conductive layer GATE1 and/or the second gate conductive layer GATE2. For example, as shown in FIGS. 6B and 6C, a part of the plurality of first connection lines 31 is disposed in the first gate conductive layer GATE1, and another part of the plurality of first connection lines 31 is disposed in the second gate conductive layer GATE2; orthographic projections of the first connection lines 31 located in the first gate conductive layer GATE1 on the substrate 115 and orthographic projections of the first connection lines 31 located in the second gate conductive layer GATE2 on the substrate 115 are staggered arranged.

As shown in FIG. 6B, the first connection line 31 located in the second gate conductive layer GATE2 is electrically connected to a second connection line 21, and may be electrically connected to the second connection line 21 through a transfer block located in the first source-drain conductive layer SD1. In this way, the fan-out trace 101, the second connection line 21 and the first connection line 31 are electrically connected in sequence. As shown in FIG. 6C, the first connection line 31 located in the first gate conductive layer GATE1 is electrically connected to a second connection line 21, and may be electrically connected to the second connection line 21 through a transfer block located in the second gate conductive layer GATE2 and a transfer block located in the first source-drain conductive layer SD1. In this way, the fan-out trace 101, the second connection line 21 and the first connection line 31 are electrically connected in sequence.

As shown in FIG. 6A, the electrostatic protection region 40 is provided therein with an electrostatic discharge circuit. The electrostatic discharge circuit is used to dissipate static electricity generated inside the first display panel 110 to avoid static electricity breakdown.

As shown in FIGS. 6A to 6C, the test region 50 is provided therein with a test circuit 51, and the test circuit 51 is electrically connected to the first connection line 31. As shown in FIGS. 6B and 6C, the test circuit 51 may be disposed in the second source-drain conductive layer SD2.

As shown in FIG. 6B, the test circuit 51 located in the second source-drain conductive layer SD2 is electrically connected to the first connection line 31, and may be electrically connected to the first connection line 31 through a transfer block located in the first source-drain conductive layer SD1. As shown in FIG. 6C, the test circuit 51 located in the second source-drain conductive layer SD2 is electrically connected to the first connection line 31, and may be electrically connected to the first connection line 31 through a transfer block located in the first source-drain conductive layer SD1 and a transfer block located in the second gate conductive layer GATE2.

As shown in FIG. 6A, the third fan-out region 60 is provided therein with a plurality of third connection lines 61, and each third connection line 61 extends from a side of the third fan-out region 60 proximate to the test region 50 to a side of the third fan-out region 60 away from the test region 50. The plurality of third connection lines 61 are electrically connected to the test circuit 51 and are in one-to-one correspondence with the plurality of first connection lines 31.

As shown in FIG. 6A, the plurality of third connection lines 61 may be located in the first gate conductive layer GATE1 and/or the second gate conductive layer GATE2. For example, as shown in FIGS. 6B and 6C, a part of the plurality of third connection lines 61 is disposed in the first gate conductive layer GATE1, and another part of the plurality of third connection lines 61 is disposed in the second gate conductive layer GATE2; orthographic projections of the third connection lines 61 located in the first gate conductive layer GATE1 on the substrate 115 and orthographic projections of the third connection lines 61 located in the second gate conductive layer GATE2 on the substrate 115 are staggered arranged.

As shown in FIG. 6B, the third connection line 61 located in the second gate conductive layer GATE2 is electrically connected to the test circuit 51, and may be electrically connected to the test circuit 51 through a transfer block located in the first source-drain conductive layer SD1. As shown in FIG. 6C, the third connection line 61 located in the first gate conductive layer GATE1 is electrically connected to the test circuit 51, and may be electrically connected to the test circuit 51 through a transfer block located in the second gate conductive layer GATE2 and a transfer block located in the first source-drain conductive layer SD1.

As shown in FIG. 6A, the bonding region 70 is configured to be bonded to a flexible circuit board. The bonding region 70 is provided therein with a plurality of bonding pins 71. A single bonding pin 71 is electrically connected to a single third connection line 61; or multiple bonding pins 71 are electrically connected to a single third connection line 61.

The bonding pins 71 may be located in the second source-drain conductive layer SD2. As shown in FIG. 6B, the third connection line 61 located in the second gate conductive layer GATE2 is electrically connected to a bonding pin 71, and may be electrically connected to the bonding pin 71 through a transfer block located in the first source-drain conductive layer SD1. As shown in FIG. 6C, the third connection line 61 located in the first gate conductive layer GATE1 is electrically connected to a bonding pin 71, and may be electrically connected to the bonding pin 71 through a transfer block located in the second gate conductive layer GATE2 and a transfer block located in the first source-drain conductive layer SD1. However, the bonding pins 71 may be also located in multiple metal layers to reduce resistance. It will be noted that the multiple metal layers may include at least two of the first source-drain conductive layer SD1, the second source-drain conductive layer SD2, the first gate conductive layer GATE1 and the second gate conductive layer GATE2. In a case where there is a touch layer, the multiple metal layers may include at least two of the first source-drain conductive layer SD1, the second source-drain conductive layer SD2, the first gate conductive layer GATE1, the second gate conductive layer GATE2 and the touch layer.

Figure 7A:
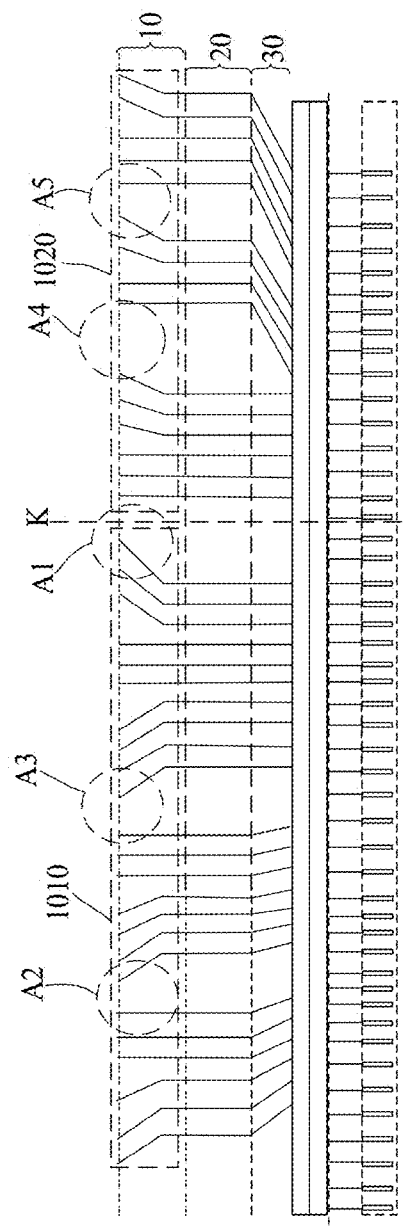
FIG. 7A is a structural diagram of another display panel, in accordance with some embodiments.

As shown in FIG. 1A, in the case where the structures of the two sides, close to and away from the rotating assembly, of the display area A of the first display panel 110 are asymmetrically arranged, as shown in FIGS. 5 and 7A, the first trace group 1010 and the second trace group 1020 of the first display panel 110 are arranged asymmetrically with respect to the reference line K. In this case, a length difference between a fan-out trace 101 in the first trace group 1010 and a fan-out trace 101 in the second trace group 1020 that are located in the first fan-out region 10 is relatively large, and thus a resistance difference between the fan-out trace 101 in the first trace group 1010 and the fan-out trace 101 in the second trace group 1020 is relatively large. As a result, there is a large difference between voltages transmitted to pixel driving circuits 12 that are respectively connected to the fan-out trace 101 in the first trace group 1010 and the fan-out trace 101 in the second trace group 1020, and there is a relatively large difference between driving currents received by light-emitting devices 11 that are connected to the pixel driving circuits 12, which causes a problem of non-uniform display luminance of the first display panel 110.

Figure 7B:
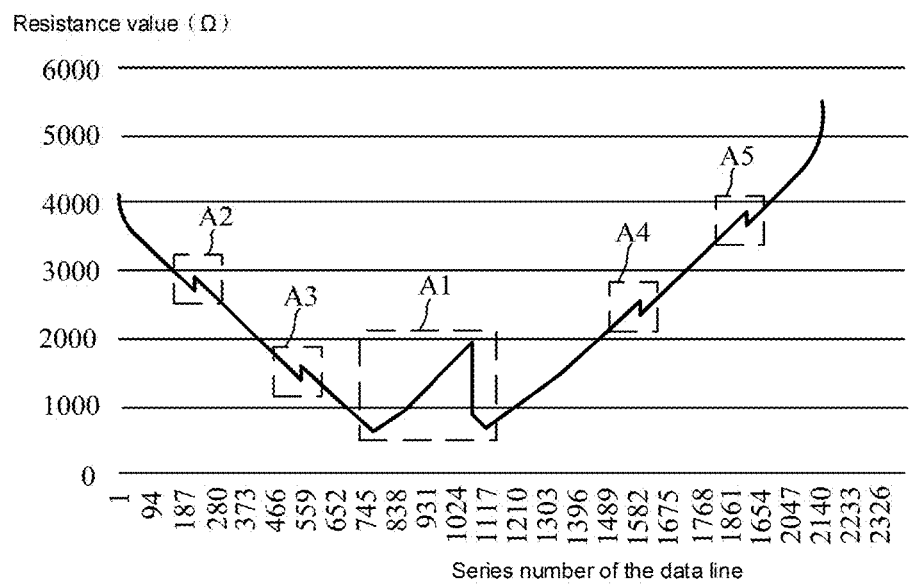
FIG. 7B is a graph showing a relationship between a series number of a data line and a resistance value, in accordance with some embodiments.

For example, as shown in FIG. 7A, there is a large length difference between fan-out traces 101 in each of regions A1, A2, A3, A4 and A5, and thus a resistance difference between two fan-out traces 101 in a same region is relatively large. FIG. 7B illustrates a sudden change of resistance values corresponding to each of the regions A1, A2, A3, A4 and A5 in FIG. 7A, and it can be seen from FIG. 7B that the sudden change of resistance values in each of the regions A1, A2, A3, A4 and A5 is relatively large.

Based on this, as shown in FIGS. 1A and 1B, some embodiments of the present disclosure provide the display panel, and the display panel may be the first display panel 110 described in any one of the above embodiments. It will be noted that an appearance of the first display panel 110 may be symmetrical or asymmetrical.

Figure 8A:
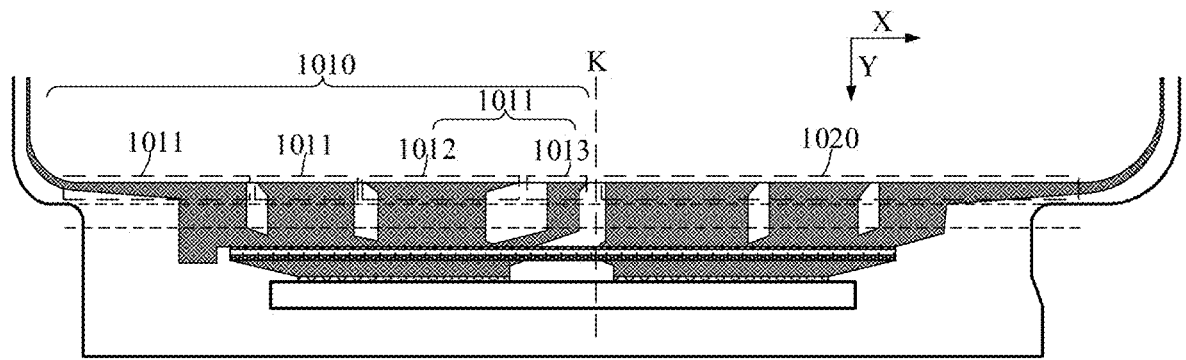
FIG. 8A is a structural diagram of yet another display panel, in accordance with some embodiments.

As shown in FIG. 8A, the first trace group 1010 includes a plurality of first trace bundles 1011 disposed in parallel in the second direction X. In order to improve the uniformity and stability of a power signal transmitted by a power signal line, the first trace group 1010 includes the plurality of first trace bundles 1011, and a group of power signal lines are provided between two adjacent first trace bundles 1011. The number of the first trace bundles 1011 is not specifically limited in the embodiments of the present disclosure, and may be set according to actual situations. A first trace bundle 1011, closest to the second trace group 1020, in the plurality of first trace bundles 1011 includes a first sub-bundle 1012 and a second sub-bundle 1013, and the second sub-bundle 1013 is closer to the second trace group 1020 than the first sub-bundle 1012.

Figure 8B:
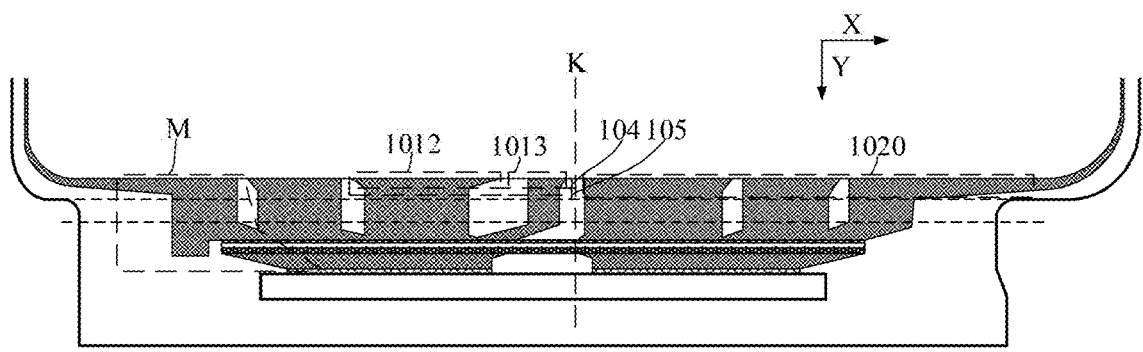
FIG. 8B is a structural diagram of yet another display panel, in accordance with some embodiments.
Figure 8C:
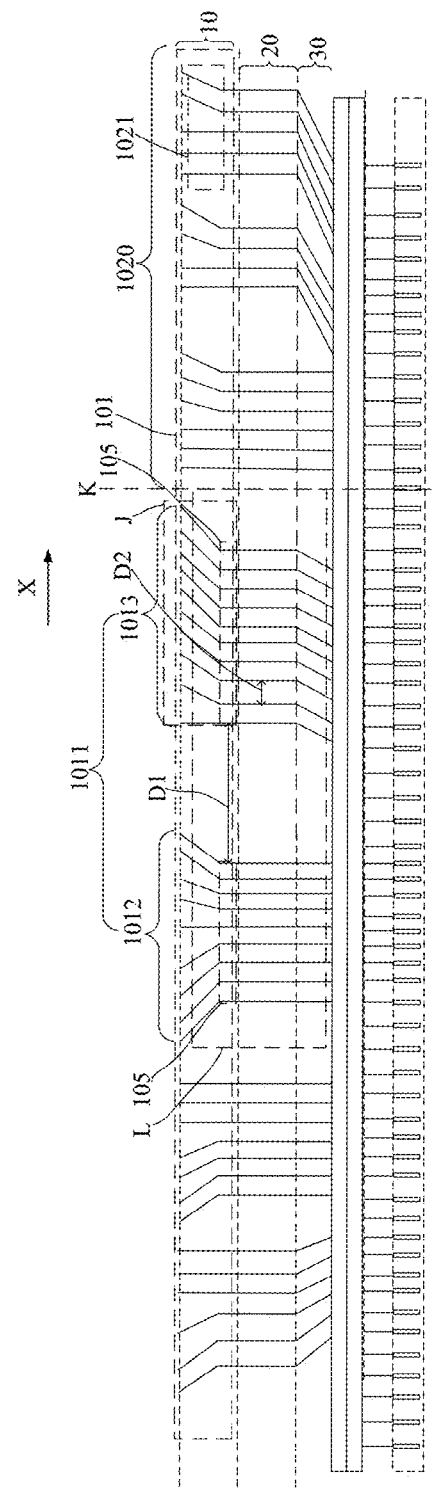
FIG. 8C is a structural diagram of yet another display panel, in accordance with some embodiments.

As shown in FIG. 8B, the first sub-bundle 1012 and the second sub-bundle 1013 each include a lead-out portion 104 and an extension portion 105 that are connected. The lead-out portion 104 is constituted by lead-out segments 102 of fan-out traces 101 in a corresponding sub-bundle, and the extension portion 105 is constituted by extension segments 103 of the fan-out traces 101 in the corresponding sub-bundle. As shown in FIG. 8C, in the second direction X, a distance D1 between the extension portion 105 of the first sub-bundle 1012 and the extension portion 105 of the second sub-bundle 1013 is greater than a distance D2 between two adjacent fan-out traces 101 in any first trace bundle 1011.

It can be seen from the above that, in the embodiments of the present disclosure, the first trace bundle 1011 closest to the second trace group 1020 in the first trace group 1010 is divided into the first sub-bundle 1012 and the second sub-bundle 1013, and the second sub-bundle 1013 is closer to the reference line K. As a result, it reduces a length of the lead-out segment 102 of the fan-out trace 101 in the second sub-bundle 1013, so as to reduce a length of the fan-out trace 101 in the second sub-bundle 1013 that is close to the second trace group 1020 in the first trace bundle 1011. Therefore, the length difference between the fan-out trace 101 in the second sub-bundle 1013 that is close to the second trace group 1020 in the first trace bundle 1011 and the fan-out trace 101 in the second trace group 1020 close to the first trace group 1010 is reduced. That is, the resistance difference between the fan-out trace 101 in the second sub-bundle 1013 that is close to the second trace group 1020 in the first trace bundle 1011 and the fan-out trace 101 in the second trace group 1020 close to the first trace group 1010 is reduced.

Figure 8D:
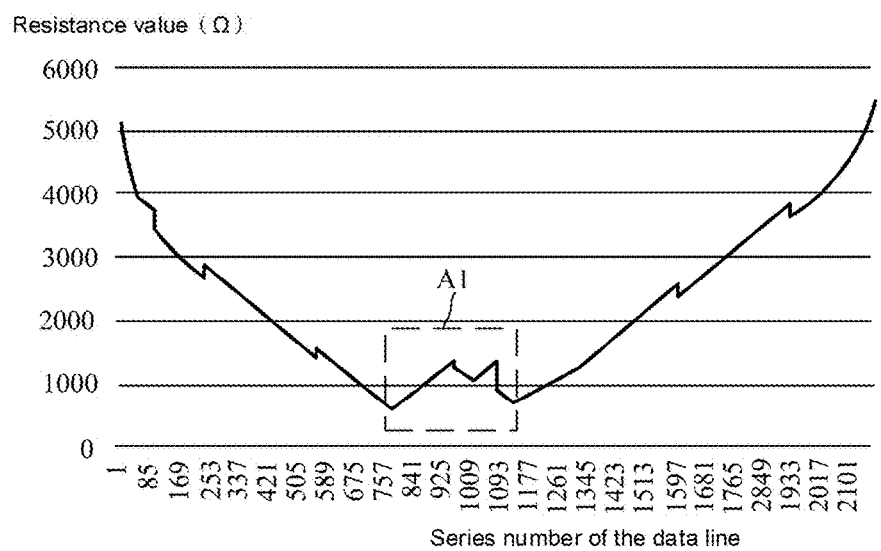
FIG. 8D is another graph showing the relationship between the series number of the data line and the resistance value, in accordance with some embodiments.

For example, a curve of resistances in the region A1 shown in FIG. 8D is smoother than a curve of resistances in the region A1 shown in FIG. 7B, and the sudden change of resistance values is alleviated, so that the resistance of the fan-out trace 101 in the region A1 shown in FIG. 7A is compensated. As a result, a relatively large resistance difference between the fan-out traces 101 in the region A1 as shown in FIG. 7A is reduced.

In this case, in a direction directed from the first trace group 1010 to the second trace group 1020 in the second direction X, from a side to another side of the reference line K, as shown in the region A1 shown in FIG. 8D, the sudden change of resistances of data lines (including data connection lines DL and fan-out traces 101) decreases. In this case, in the same display panel, a magnitude of a driving current received by the light-emitting device 11 is only related to a signal at a constant voltage terminal VDD and a data signal $V_{data}$; and therefore, in a case where a difference between data signals $V_{data}$ received by pixel driving circuits 12 is reduced, a difference between the driving currents received by the light-emitting devices 11 that are connected to the pixel driving circuits 12 will be also reduced accordingly. Thus, the problem of non-uniform display luminance of the display panel 110 is ameliorated.

Figure 9A:
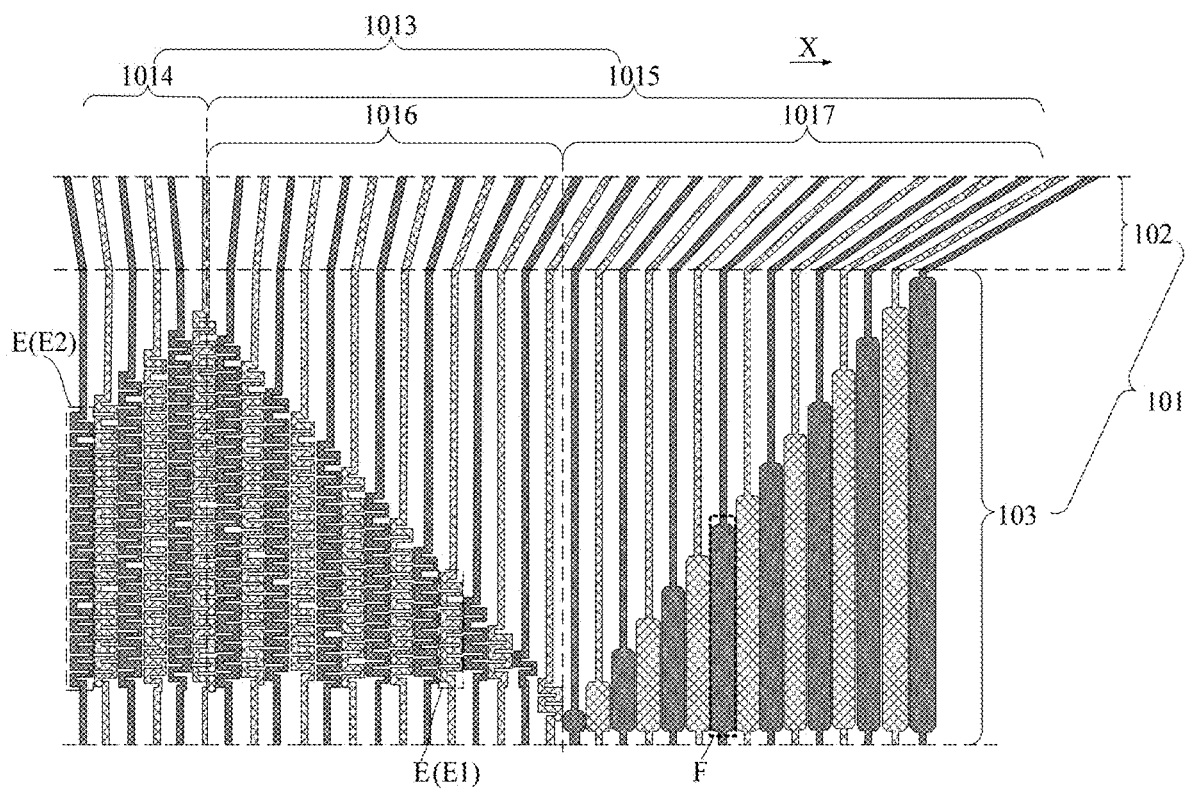
FIG. 9A is a partial enlarged view of the region J of the display panel in FIG. 8C.

In some embodiments, as shown in FIG. 9A, the second sub-bundle 1013 includes a first trace cluster 1014 and a second trace cluster 1015 that are disposed in parallel in the second direction X, and the second trace cluster 1015 is closer to the second trace group 1020 than the first trace cluster 1014.

In the direction directed from the first trace group 1010 to the second trace group 1020 in the second direction X, linear lengths of fan-out traces 101 in the second trace cluster 1015 gradually increase, and linear lengths of fan-out traces 101 in the first trace cluster 1014 gradually decrease. Here, the linear length of the fan-out trace 101 is a sum of a linear distance between two ends of the lead-out segment 102 of the fan-out trace 101 and a linear distance between two ends of the extension segment 103 of the fan-out trace 101.

In some embodiments, as shown in FIG. 9A, at least one fan-out trace 101 in the first trace cluster 1014 each has a curved portion E (which is also referred to as a second curved portion E2). In this way, for the fan-out traces 101 in the first trace cluster 1014, a length difference between the fan-out traces 101 may be reduced by arranging the curved portion E, and thus a resistance difference between data lines corresponding to the fan-out traces 101 in the first trace cluster 1014 is reduced.

For example, multiple fan-out traces 101 in the first trace cluster 1014 each have the curved portion E. In the direction directed from the first trace group 1010 to the second trace group 1020 in the second direction X, linear lengths of curved portions E of the multiple fan-out traces 101 in the first trace cluster 1014 gradually increase. In this way, for the multiple fan-out traces 101 in the first trace cluster 1014, the difference between linear lengths of the fan-out traces 101 may be compensated by the linear lengths of the curved portions E, and thus the resistance difference between the data lines corresponding to the multiple fan-out traces 101 in the first trace cluster 1014 is reduced. Here, the linear length of the curved portion E is a length of the trace of the curved portion E.

In some embodiments, as shown in FIG. 9A, at least one fan-out trace 101 in the second trace cluster 1015 each has a curved portion E (which is also referred to as a first curved portion E1). In this way, for the fan-out traces 101 in the second trace cluster 1015, a length difference between the fan-out traces 101 may be reduced by arranging the curved portion E, and thus a resistance difference between data lines corresponding to the fan-out traces 101 in the second trace cluster 1015 is reduced.

For example, the second trace cluster 1015 includes a first sub-cluster 1016 and a second sub-cluster 1017 that are disposed in parallel in the second direction X, and the second sub-cluster 1017 is closer to the second trace group 1020 than the first sub-cluster 1016. Multiple fan-out traces 101 in the first sub-cluster 1016 each have a curved portion E.

In the direction directed from the first trace group 1010 to the second trace group 1020 in the second direction X, linear lengths of curved portions E of the multiple fan-out traces 101 in the first sub-cluster 1016 gradually decrease. In this way, for the multiple fan-out traces 101 in the first sub-cluster 1016, the difference between linear lengths of the fan-out traces 101 may be compensated by the linear lengths of the curved portions E, and thus the resistance difference between data lines corresponding to the multiple fan-out traces 101 in the first sub-cluster 1016 is reduced. It will be noted that the linear length of the curved portion E is a length of the trace of the curved portion E.

The curved portion E may be arranged in the lead-out segment 102 of a corresponding fan-out trace 101, or may be arranged in the extension segment 103 of the corresponding fan-out trace 101. For example, as shown in FIG. 9A, the curved portion E is arranged in the extension segment 103 of the corresponding fan-out trace 101. In addition, a line width of the curved portion E (a direction of the line width being the second direction X) may be substantially equal to a line width of another portion of the corresponding fan-out trace 101 except the curved portion E.

It will be noted that, the line width of the curved portion E may also be different from the line width of the another portion of the corresponding fan-out trace 101 except the curved portion E, and may be adjusted to balance the resistances of data lines corresponding to the fan-out traces 101, which is not specifically limited in the embodiments of the present disclosure.

In some embodiments, as shown in FIG. 9A, at least one fan-out trace 101 in the second trace cluster 1015 each has a widened portion F, and a line width of the widened portion F is greater than a line width of another portion of the corresponding fan-out trace 101 except the widened portion F. In this way, for the fan-out traces 101 in the second trace cluster 1015, the resistance difference caused by the length difference between the fan-out traces 101 may be reduced by arranging the widened portion F, and thus the resistance difference between the data lines corresponding to the fan-out traces 101 in the second trace cluster 1015 is reduced.

For example, the second trace cluster 1015 includes a first sub-cluster 1016 and a second sub-cluster 1017 that are disposed in parallel in the second direction X, and the second sub-cluster 1017 is closer to the second trace group 1020 than the first sub-cluster 1016. Multiple fan-out traces 101 in the second sub-cluster 1017 each have a widened portion F.

In the direction directed from the first trace group 1010 to the second trace group 1020 in the second direction X, linear lengths of widened portions F of the multiple fan-out traces 101 in the second sub-cluster 1017 gradually increase. In this way, the resistances of the multiple fan-out traces 101 in the second sub-cluster 1017 may be reduced through the widened portions F, which compensates for the increase in resistance caused by the increase of the linear length of the fan-out traces 101. As a result, the resistance difference between data lines corresponding to the fan-out traces 101 in the second sub-cluster 1017 is reduced. Here, the linear length of the widened portion F is a linear distance between two ends of the widened portion F.

It will be noted that, the embodiments in which the at least one fan-out trace 101 in the second trace cluster 1015 has the curved portion E may be combined with the embodiments in which the at least one fan-out trace 101 in the second trace cluster 1015 has the widened portion F in any suitable manner, which is not specifically limited in the embodiments of the present disclosure.

The widened portion F may be arranged in the lead-out segment 102 of a corresponding fan-out trace 101, or may be arranged in the extension segment 103 of the corresponding fan-out trace 101. For example, as shown in FIG. 9A, the widened portion F is arranged in the extension segment 103 of the corresponding fan-out trace 101. In addition, the widened portion F may be arranged in a linear manner.

It will be noted that the widened portion F may also be arranged in a curved manner, and may be adjusted to balance the resistances of the data lines corresponding to the fan-out traces 101, which is not specifically limited in the embodiments of the present disclosure.

In some embodiments, resistances of fan-out traces 101 in the second sub-bundle 1013 are in a first preset resistance range; and/or a resistance difference between a fan-out trace 101, closest to the second trace group 1020, in the second sub-bundle 1013 and a fan-out trace 101, closest to the second sub-bundle 1013, in the second trace group 1020 is in a first preset resistance range.

For example, the resistances of the fan-out traces 101 in the second sub-bundle 1013 are in the first preset resistance range. Here, the resistances of the fan-out traces 101 in the second sub-bundle 1013 refer to resistances of data lines DL corresponding to the fan-out traces 101 in the second sub-bundle 1013. The first preset resistance value range refers to a range of resistances of the data lines DL corresponding to the fan-out traces 101 in the second sub-bundle 1013. For example, the first preset resistance range is 1050Ω to 1200Ω. For example, referring to FIG. 9B, the resistances of the data lines (in the region A1) corresponding to the fan-out traces 101 in the second sub-bundle 1013 are in the range of 1050Ω to 1200Ω, inclusive.

For example, the resistance difference between the fan-out trace 101, closest to the second trace group 1020, in the second sub-bundle 1013 and the fan-out trace 101, closest to the second sub-bundle 1013, in the second trace group 1020 is in the first preset resistance range. Here, the resistance difference between the fan-out trace 101 in the second sub-bundle 1013 and the fan-out trace 101 in the second trace group 1020 refers to a resistance difference between a data line DL corresponding to the fan-out trace 101 in the second sub-bundle 1013 and a data line DL corresponding to the fan-out trace 101 in the second trace group 1020. The first preset resistance range refers to a range of a resistance difference between the data line DL corresponding to the fan-out trace 101 in the second sub-bundle 1013 and the data line DL corresponding to the fan-out trace 101 in the second trace group 1020. For example, the first preset resistance range is 300Ω to 500Ω. For example, referring to FIG. 9B, the resistance difference between the fan-out trace 101, closest to the second trace group 1020, in the second sub-bundle 1013 and the fan-out trace 101, closest to the second sub-bundle 1013, in the second trace group 1020 is in a range of 300Ω to 500Ω, inclusive.

Figure 9B:
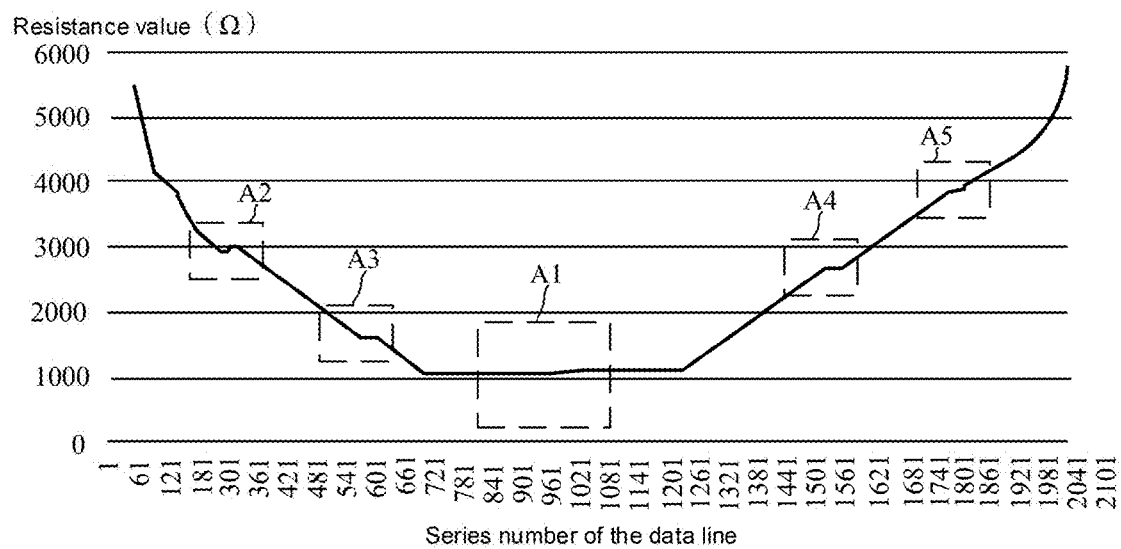
FIG. 9B is yet another graph showing the relationship between the series number of the data line and the resistance value, in accordance with some embodiments.

In summary, as shown in FIG. 7A, for the fan-out traces 101 in the region A1 (i.e., the fan-out traces 101 in the first trace cluster 1014 and second trace cluster 1015), by arranging the curved portion E and/or the widened portion F, it may be possible to compensate for the resistance difference caused by increase or decrease of the length difference between the fan-out traces 101, so as to reduce the resistance difference between the data lines corresponding to the fan-out traces 101; the final result is shown in FIG. 9B, a trend of sudden change of the resistance values in the region A1 is ameliorated, the resistance is compensated, and the resistance difference is gradually reduced.

Figure 10:
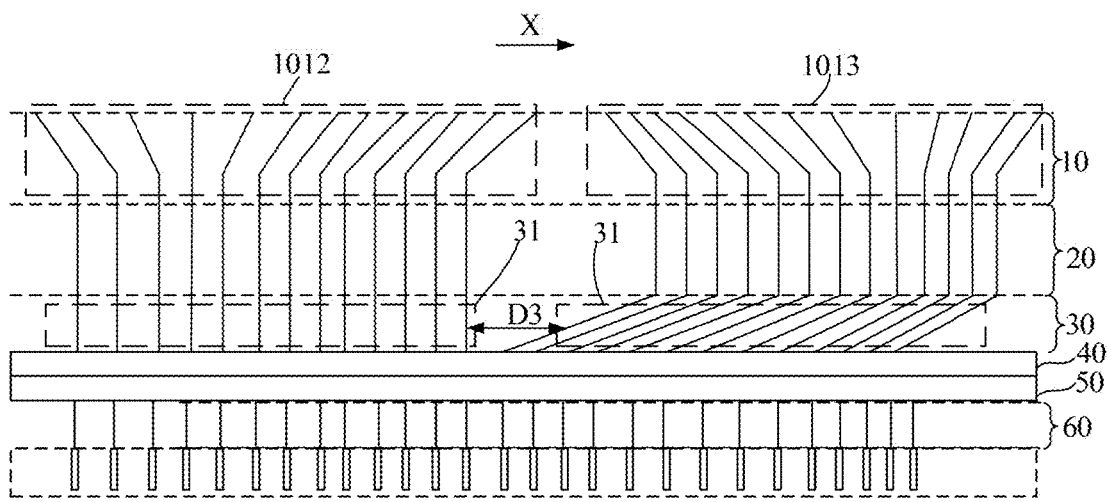
FIG. 10 is a partial enlarged view of the region L of the display panel in FIG. 8C.

In some embodiments, as shown in FIG. 10, in the second direction X, a distance D3 exists between first connection lines 31 that are connected to the first sub-bundle 1012 and first connection lines 31 that are connected to the second sub-bundle 1013.

In a direction directed from the side of the second fan-out region 30 proximate to the bending region 20 to the side of the second fan-out region 30 away from the bending region 20, the first connection lines 31 that are connected to the second sub-bundle 1013 gradually approach the first connection lines 31 that are connected to the first sub-bundle 1012, so that an area occupied by the first connection lines 31 that are connected to the second sub-bundle 1013 is reduced.

Figure 11:
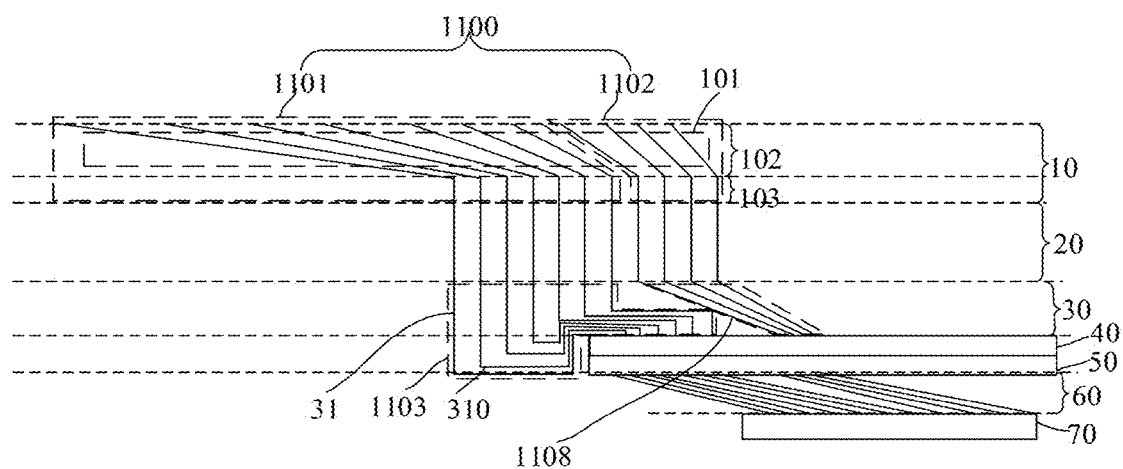
FIG. 11 is a partial enlarged view of the region M of the display panel in FIG. 8B.

In some embodiments, as shown in FIGS. 8A and 11, in the direction directed from the first trace group 1010 to the second trace group 1020 in the second direction X, a first trace bundle 1011, farthest away from the second trace group 1020, in the plurality of first trace bundles 1011 is a target first trace bundle 1100, and linear lengths of fan-out traces 101 in the target first trace bundle 1100 gradually decrease. The target first trace bundle 1100 includes a third sub-bundle 1101 and a fourth sub-bundle 1102, and the third sub-bundle 1101 is farther away from the second trace group 1020 than the fourth sub-bundle 1102.

In the plurality of first connection lines 31, first connection lines 31 that are connected to fan-out traces 101 in the third sub-bundle 1101 constitute a fifth sub-bundle 1103. An extension length of each first connection line 31 in the fifth sub-bundle 1103 is greater than a linear length of the first connection line 31. The extension length of the first connection line 31 is a length of an extension path of the first connection line 31, and the linear length of the first connection line 31 is a linear distance between two ends of the first connection line 31.

Figure 12:
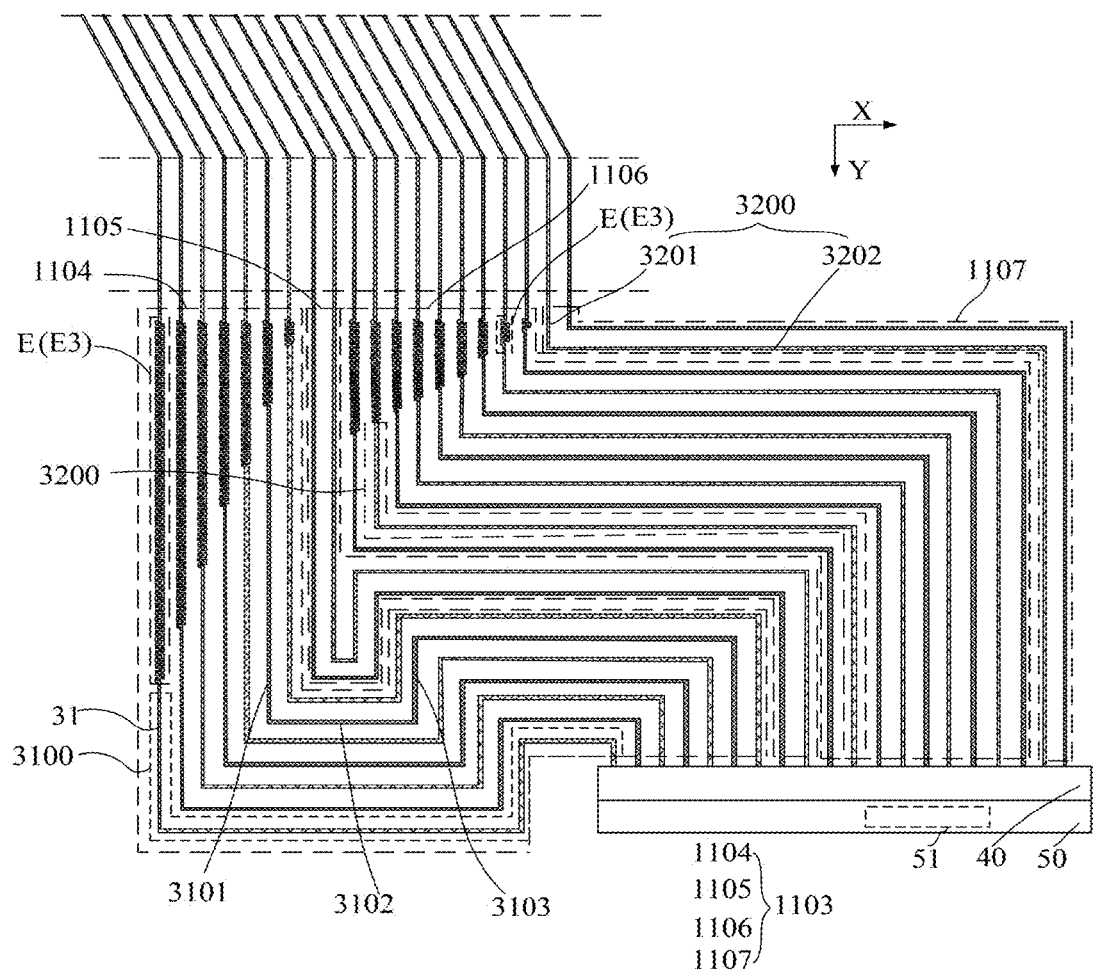
FIG. 12 is another partial enlarged view of the region M of the display panel in FIG. 8B.

Based on this, as shown in FIG. 11, at least one first connection line 31 in the fifth sub-bundle 1103 each has a polyline portion 310, the polyline portion 310 includes a plurality of segments connected in sequence, and not all of the plurality of segments extend in same directions; and/or, as shown in FIG. 12, at least one first connection line 31 in the fifth sub-bundle 1103 each has a curved portion E (which is also referred to as a third curved portion E3).

In this way, a length difference between fan-out traces 101 in the third sub-bundle 1101 and partial fan-out traces 101 in the second trace group 1020 away from the first trace group 1010 may be compensated by the polyline portion 310 and/or the curved portion E of the first connection line 31 in the fifth sub-bundle 1103. That is, a resistance difference between data lines corresponding to the fan-out traces 101 in the third sub-bundle 1101 and data lines corresponding to the partial fan-out traces 101 in the second trace group 1020 away from the first trace group 1010 is compensated. As a result, the problem of non-uniform display luminance of the display panel 110 is ameliorated.

For example, 1-st to 150-th data lines in FIG. 8D are data lines corresponding to the first connection lines 31 in the fifth sub-bundle 1103, the polyline portion 310 and/or the curved portion E of the first connection line 31 may make a resistance value of a corresponding data line increase, thereby reducing resistance differences between the 1-st to 150-th data lines and 1951-st to 2101-st data lines, and making the resistances of the 1-st to 150-th data lines be substantially equal to the resistances of the 1951-st to 2101-st data lines.

In addition, a resistance difference between data lines corresponding to the fan-out traces 101 in the third sub-bundle 1101 may also be reduced by adjusting a length of the polyline portion 310 and/or a length of the curved portion E of the first connection line 31 in the fifth sub-bundle 1103.

For example, referring to FIG. 12, the fifth sub-bundle 1103 includes a first connection line cluster 1104 and a second connection line cluster 1105 that are disposed in parallel in the second direction X, and the first connection line cluster 1104 is farther away from the second trace group 1020 than the second connection line cluster 1105. First connection lines 31 in the first connection line cluster 1104 and first connection lines 31 in the second connection line cluster 1105 each have a first polyline portion 3100. The first connection lines 31 in the first connection line cluster 1104 each further have a curved portion E.

Based on this, in the direction directed from the first trace group 1010 to the second trace group 1020 in the second direction X, linear lengths of first polyline portions 3100 of the first connection lines 31 in the first connection line cluster 1104 and second connection line cluster 1105 gradually decrease, the linear length of the first polyline portion 3100 being a sum of linear distances between two ends of each segment of the first polyline portion 3100; and/or, in the direction directed from the first trace group 1010 to the second trace group 1020 in the second direction X, linear lengths of curved portions E of the first connection lines 31 in the first connection line cluster 1104 gradually decrease.

As shown in FIGS. 8D and 12, the curved portions E of the first connection lines 31 in the first connection line cluster 1104 are used to compensate for the resistance values of the 1-st to 50-th data lines, so that the resistance values of the 1-st to 50-th data lines increase. As a result, the resistance difference between traces on two sides of the reference line K is reduced; in addition, a sudden change due to a relatively large difference between the resistance values of the 1-st to 50-th data lines may be reduced.

As shown in FIGS. 8D and 12, first polyline portions 3100 of the first connection lines 31 in the second connection line cluster 1105 are used to compensate for resistance values of the 51-th to 100-th data lines, thereby reducing the resistance difference between the data lines.

For example, as shown in FIG. 12, the fifth sub-bundle 1103 further includes a third connection line cluster 1106 and a fourth connection line cluster 1107 that are disposed in parallel in the second direction X, the third connection line cluster 1106 is farther away from the second trace group 1020 than the fourth connection line cluster 1107, and the third connection line cluster 1106 and the fourth connection line cluster 1107 are closer to the second trace group 1020 than the first connection line cluster 1104 and the second connection line cluster 1105. First connection lines 31 in the third connection line cluster 1106 and first connection lines 31 in the fourth connection line cluster 1107 each have a second polyline portion 3200. The first connection lines 31 in the third connection line cluster 1106 each further have a curved portion E.

Based on this, in the direction directed from the first trace group 1010 to the second trace group 1020 in the second direction X, linear lengths of second polyline portions 3200 of the first connection lines 31 in the third connection line cluster 1106 and fourth connection line cluster 1107 gradually decrease, the linear length of the second polyline portion 3200 being a sum of linear distances between two ends of each segment of the second polyline portion 3200; and/or, in the direction directed from the first trace group 1010 to the second trace group 1020 in the second direction X, linear lengths of curved portions E of the first connection lines 31 in the third connection line cluster 1106 gradually decrease.

Referring to FIGS. 9B and 12, the curved portions E of the first connection lines 31 in the third connection line cluster 1106 are used to compensate for 101-st to 150-th data lines, so that resistance values of the 101-st to 150-th data lines increase and are substantially equal to resistances of the 1951-st to 2000-th data lines.

As shown in FIG. 8D, since a difference between a resistance value of the 100-th data line and a resistance value of the 101-st data line is relatively large, the resistance value of the 101-st data line increases, which reduces the difference between the resistance value of the 100-th data line and the resistance value of the 101-st data line.

It can be seen from FIG. 9B that, the resistance values of the 1-st to 100-th data lines are compensated, the sudden change is reduced, and the curve is relatively smooth.

The resistances of the 1-st to 150-th data lines are compensated, and in this case, lengths of data lines that are respectively located on two sides of the reference line of the display panel are substantially equal, resistances of the data lines are also substantially equal, and voltages received by pixel driving circuits 12 that are connected to the data lines are also substantially equal. Therefore, the display luminance of the display panel 110 is more uniform.

In some embodiments, in the direction directed from the first trace group 1010 to the second trace group 1020 in the second direction X, extension lengths of first connection lines 31 in the first connection line cluster 1104, second connection line cluster 1105, third connection line cluster 1106 and fourth connection line cluster 1107 gradually decrease.

In some embodiments, as shown in FIG. 12, the first polyline portion 3100 is located on a side of the test circuit 51 in the second direction X. The first polyline portion 3100 includes a first polyline segment 3101, a second polyline segment 3102 and a third polyline segment 3103 that are connected in sequence, the first polyline segment 3101 and the third polyline segment 3103 substantially extend in the first direction Y, and the second polyline segment 3102 substantially extends in the second direction X. For example, the first polyline segment 3101, the second polyline segment 3102 and the third polyline segment 3103 are connected in a "U" shape.

The first polyline segment 3101 is connected to a corresponding fan-out trace 101, the third polyline segment 3103 is connected to the test circuit 51, and the first polyline segment 3101 is farther away from the second trace group 1020 than the third polyline segment 3103. The first polyline portion 3100 in the first connection line cluster 1104 at least partially surrounds the first polyline portion 3100 in the second connection line cluster 1105, thereby preventing the trace in the first connection line cluster 1104 from intersecting the trace in the second connection line cluster 1105.

Based on this, as shown in FIG. 12, the curved portion E of the first connection line 31 in the first connection line cluster 1104 is arranged at the first polyline segment 3101 of the first polyline portion 3100 of the first connection line 31.

It will be noted that, the curved portion E of the first connection line 31 in the first connection line cluster 1104 may also be arranged at the second polyline segment 3102 and/or the third polyline segment 3103, which is not specifically limited in the embodiments of the present disclosure.

In some embodiments, as shown in FIG. 12, the second polyline portion 3200 is located on a side of the test circuit 51 proximate to the second fan-out region 30. The second polyline portion 3200 includes a fourth polyline segment 3201 and a fifth polyline segment 3202 that are connected in sequence. The fourth polyline segment 3201 substantially extends in the first direction Y, and the fifth polyline segment 3202 substantially extends in the second direction X. Here, the fourth polyline segment 3201 and the fifth polyline segment 3202 may be perpendicular to each other and be L-shaped. The fourth polyline segment 3201 is connected to a corresponding fan-out trace 101, and the fifth polyline segment 3202 is connected to the test circuit 51. The second polyline portion 3200 in the third connection line cluster 1106 at least partially surrounds the second polyline portion 3200 in the fourth connection line cluster 1107.

Based on this, as shown in FIG. 12, the curved portion E of the first connection line 31 in the third connection line cluster 1106 is arranged at the fourth polyline segment 3201 of the second polyline portion 3200 of the first connection line 31.

It will be noted that, the curved portion E of the first connection line 31 in the third connection line cluster 1106 may also be arranged at the fifth polyline segment 3202, which is not specifically limited in the embodiments of the present disclosure.

In some embodiments, as shown in FIG. 11, in the plurality of first connection lines 31, first connection lines 31 that are connected to fan-out traces 101 in the fourth sub-bundle 1102 constitute a sixth sub-bundle 1108. An extension length of each first connection line 31 in the sixth sub-bundle 1108 is substantially equal to a linear length thereof.

Referring to FIG. 8C, a sum of an extension length of a fan-out trace 101 that is farthest away from the second trace group 1020 in the first trace group 1010 and an extension length a first connection line 31 connected to the fan-out trace 101 is a first length. A sum of an extension length of a fan-out trace 101 farthest away from the first trace group 1010 in the second trace group 1020 and an extension length of a first connection line 31 connected to the fan-out trace 101 is a second length. A sum of a resistance of the fan-out trace 101 that is farthest away from the second trace group 1020 in the first trace group 1010 and a resistance of the first connection line 31 connected to the fan-out trace 101 is a first resistance. A sum of a resistance of the fan-out trace 101 that is farthest away from the first trace group 1010 in the second trace group 1020 and a resistance of the first connection line 31 connected to the fan-out trace 101 is a second resistance.

The first length is substantially equal to the second length. That is, the first resistance is substantially equal to the second resistance.

In this case, lengths of data lines that are respectively located on edges of the two side of the reference line K of the first display panel 110 are substantially equal, resistances of the data lines are substantially equal, and voltages received by the pixel driving circuits 12 that are connected to the data lines are also substantially equal. Therefore, the display luminance of the display panel 110 is more uniform.

In some embodiments, as shown in FIG. 8C, in the direction directed from the first trace group 1010 to the second trace group 1020 in the second direction X, linear lengths of fan-out traces 101 in each of two adjacent first trace bundles 1011 gradually decrease.

Figure 13:
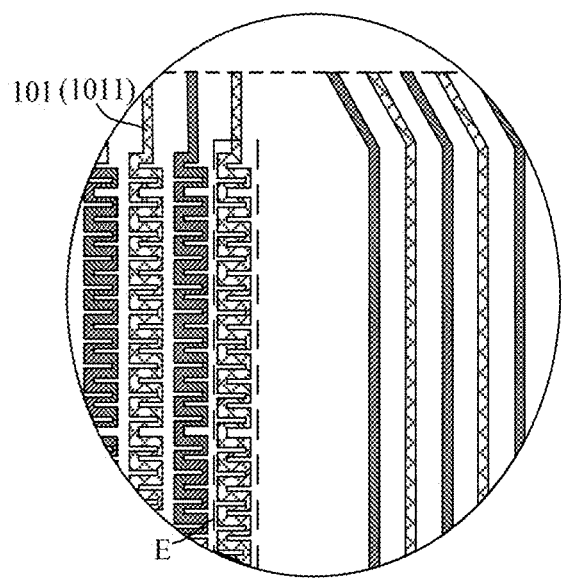
FIG. 13 is a partial enlarged view of the region A2 or A3 of the display panel in FIG. 7A.

Based on this, as shown in FIGS. 7A and 13, at least one fan-out trace 101 in a first trace bundle 1011 that is farther away from the second trace group 1020 in the two adjacent first trace bundles 1011 has a curved portion E, and in the first trace bundle 1011 that is farther away from the second trace group 1020 in the two adjacent first trace bundles 1011, the fan-out trace 101 having the curved portion E is closer to the second trace group 1020 than other fan-out traces 101.

In this way, by arranging the curved portion E, the length difference between the fan-out traces 101 is reduced, and thus the resistance difference between the data lines corresponding to the fan-out traces 101 in the first trace bundle 1011 is reduced. Corresponding to FIG. 7B, a condition of sudden change of resistance values in the regions A2 and A3 is ameliorated. After the resistance is compensated, the resistance values in the regions A2 and A3 are as shown in FIG. 9B, and the curve of the resistances is smoother, and the sudden change is reduced.

It will be noted that, a specific shape of the curved portion E may be a wave shape, a sawtooth shape, etc. In a case where the shape of the curved portion E is the wave shape and/or sawtooth shape, the length of the curved portion E of the fan-out trace 101 may be greater.

Figure 14:
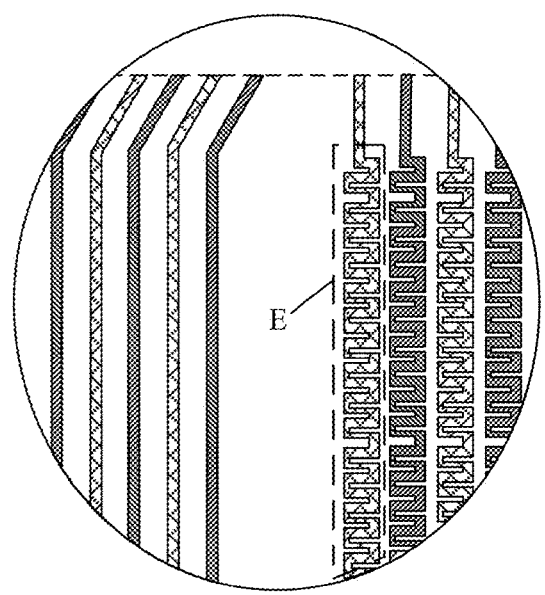
FIG. 14 is a partial enlarged view of the region A4 or A5 of the display panel in FIG. 7A.

In some embodiments, as shown in FIG. 8C, the second trace group 1020 includes a plurality of second trace bundles 1021 that are disposed in parallel in the second direction X. As shown in FIGS. 7A and 14, in a direction directed from the second trace group 1020 to the first trace group 1010 in the second direction X, linear lengths of fan-out traces 101 in each of two adjacent second trace bundles 1021 gradually decrease.

Based on this, at least one fan-out trace 101 in a second trace bundle 1021 that is farther away from the first trace group 1010 in the two adjacent second trace bundles 1021 has a curved portion E, and in the second trace bundle 1021, the fan-out trace 101 having the curved portion E is closer to the first trace group 1010 than other fan-out traces 101.

It will be noted that, a specific shape of the curved portion E may be a wave shape, a sawtooth shape, etc. In a case where the shape of the curved portion E is the wave shape and/or sawtooth shape, the length of the curved portion E of the fan-out trace 101 may be greater.

In this way, by arranging the curved portion E, the length difference between the fan-out traces 101 is reduced, and thus the resistance difference between the data lines corresponding to the fan-out traces 101 in the second trace bundle 1012 is reduced. Corresponding to FIG. 7B, a condition of sudden change of resistance values in the regions A4 and A5 is ameliorated. After the resistance is compensated, the resistance values in the regions A4 and A5 are as shown in FIG. 9B, and the curve of the resistances is smoother, and the sudden change is reduced.

In summary, the length difference between the fan-out traces 101 is compensated by the curved portion E, the widened portion F and the polyline portion 310, so that the resistance difference between the data lines corresponding to the fan-out traces 101 is reduced, the sudden change of the resistance values is reduced, and the curve of a relationship between the series number of the data line and the resistance value is smoother. In this case, the sudden change of the resistances of the data lines is reduced. In the same display panel, the magnitude of the driving current received by the light-emitting device 11 is only related to the signal at the constant voltage terminal VDD and the data signal $V_{data}$; and therefore, in the case where the difference of the data signals $V_{data}$ received by the pixel driving circuits 12 is reduced, the difference between the driving currents received by the light-emitting devices 11 that are connected to the pixel driving circuits 12 will also be reduced accordingly, thereby ameliorating the problem of non-uniform display luminance of the first display panel 110.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a display area, a first fan-out region, and a bending region that are sequentially disposed in a first direction; wherein the display panel comprises a plurality of fan-out traces disposed in the first fan-out region, the plurality of fan-out traces extend from a side of the first fan-out region proximate to the display area to a side of the first fan-out region proximate to the bending region; a fan-out trace in the plurality of fan-out traces includes a lead-out segment and an extension segment that are connected, and the lead-out segment is closer to the display area than the extension segment;

the plurality of fan-out traces are divided into a first trace group and a second trace group that are disposed in parallel in a second direction, and the first trace group and the second trace group are asymmetrically arranged with respect to a reference line, wherein the reference line is a straight line in the first direction and bisects the display panel; the first direction and the second direction intersect;

the first trace group includes a plurality of first trace bundles that are disposed in parallel in the second direction; a first trace bundle, closest to the second trace group, in the plurality of first trace bundles includes a first sub-bundle and a second sub-bundle, and the second sub-bundle is closer to the second trace group than the first sub-bundle;

the first sub-bundle and the second sub-bundle each include a lead-out portion and an extension portion that are connected, the lead-out portion is constituted by lead-out segments of fan-out traces in a corresponding sub-bundle, and the extension portion is constituted by extension segments of the fan-out traces in the corresponding sub-bundle; in the second direction, a distance between the extension portion of the first sub-bundle and the extension portion of the second sub-bundle is greater than a distance between two adjacent fan-out traces in any first trace bundle in the plurality of first trace bundles.

2. The display panel according to claim 1, wherein the second sub-bundle includes a first trace cluster and a second trace cluster that are disposed in parallel in the second direction, and the second trace cluster is closer to the second trace group than the first trace cluster;

in a direction directed from the first trace group to the second trace group in the second direction, linear lengths of fan-out traces in the second trace cluster gradually increase; a linear length of the fan-out trace is a sum of a linear distance between two ends of the lead-out segment of the fan-out trace and a linear distance between two ends of the extension segment of the fan-out trace;

at least one fan-out trace in the second trace cluster each has a first curved portion; and/or at least one fan-out trace in the second trace cluster each has a widened portion, and in the second direction, a line width of the widened portion is greater than a line width of another portion of a corresponding fan-out trace except the widened portion.

3. The display panel according to claim 2, wherein the second trace cluster includes a first sub-cluster and a second sub-cluster that are disposed in parallel in the second direction, and the second sub-cluster is closer to the second trace group than the first sub-cluster;

fan-out traces in the first sub-cluster each have the first curved portion; and/or fan-out traces in the second sub-cluster each have the widened portion.

4. The display panel according to claim 3, wherein in the direction directed from the first trace group to the second trace group in the second direction, linear lengths of first curved portions of the fan-out traces in the first sub-cluster gradually decrease; and/or in the direction directed from the first trace group to the second trace group in the second direction, linear lengths of widened portions of the fan-out traces in the second sub-cluster gradually increase.

5. The display panel according to claim 2, wherein in the direction directed from the first trace group to the second trace group in the second direction, linear lengths of fan-out traces in the first trace cluster gradually decrease; and at least one fan-out trace in the first trace cluster each has a second curved portion; or fan-out traces in the first trace cluster each have the second curved portion; in the direction directed from the first trace group to the second trace group in the second direction, linear lengths of second curved portions of the fan-out traces in the first trace cluster gradually increase.

6. The display panel according to claim 2, wherein the first curved portion is arranged in an extension segment of a corresponding fan-out trace; and/or in the second direction, a line width of the first curved portion is substantially equal to a line width of another portion of the corresponding fan-out trace except the first curved portion; and/or the widened portion is arranged in an extension segment of a corresponding fan-out trace; and/or the widened portion is arranged in a linear manner.

7. The display panel according to claim 1, wherein the display panel further has a second fan-out region located on a side of the bending region away from the first fan-out region;

the display panel further comprises a plurality of first connection lines disposed in the second fan-out region, wherein the plurality of first connection lines extend from a side of the second fan-out region proximate to the bending region to a side of the second fan-out region away from the bending region, and a first connection line in the plurality of first connection lines is electrically connected to the fan-out trace;

in the second direction, a distance exists between first connection lines connected to the first sub-bundle and first connection lines connected to the second sub-bundle; and in a direction directed from the side of the second fan-out region proximate to the bending region to the side of the second fan-out region away from the bending region, the first connection lines connected to the second sub-bundle gradually approach the first connection lines connected to the first sub-bundle.

8. The display panel according to claim 1, wherein the display panel further has a second fan-out region located on a side of the bending region away from the first fan-out region;

the display panel further comprises a plurality of first connection lines disposed at least in the second fan-out region, wherein the plurality of first connection lines extend from a side of the second fan-out region proximate to the bending region to a side of the second fan-out region away from the bending region, and a first connection line in the plurality of first connection lines is electrically connected to the fan-out trace;

in a direction directed from the first trace group to the second trace group in the second direction, a first trace bundle, farthest away from the second trace group, in the plurality of first trace bundles is a target first trace bundle, and linear lengths of fan-out traces in the target first trace bundle gradually decrease; the target first trace bundle includes a third sub-bundle and a fourth sub-bundle, and the third sub-bundle is farther away from the second trace group than the fourth sub-bundle;

in the plurality of first connection lines, first connection lines that are connected to fan-out traces in the third sub-bundle constitute a fifth sub-bundle, and an extension length of a first connection line in the fifth sub-bundle is greater than a linear length of the first connection line; the extension length of the first connection line is a length of an extension path of the first connection line, and the linear length of the first connection line is a linear distance between two ends of the first connection line;
at least one first connection line in the fifth sub-bundle each has a polyline portion, the polyline portion includes a plurality of segments connected in sequence, and not all of the plurality of segments extend in same directions; and/or at least one first connection line in the fifth sub-bundle each has a third curved portion.

9. The display panel according to claim 8, wherein the fifth sub-bundle includes a first connection line cluster and a second connection line cluster that are disposed in parallel in the second direction, and the first connection line cluster is farther away from the second trace group than the second connection line cluster;
the polyline portion includes a first polyline portion, first connection lines in the first connection line cluster and first connection lines in the second connection line cluster each have the first polyline portion; and
the first connection lines in the first connection line cluster each further have the third curved portion.

10. The display panel according to claim 9, wherein the display panel further comprises a test circuit disposed on the side of the second fan-out region away from the bending region, and the first polyline portion is located on a side of the test circuit in the second direction;
the first polyline portion includes a first polyline segment, a second polyline segment and a third polyline segment that are connected in sequence, the first polyline segment and the third polyline segment substantially extend in the first direction, and the second polyline segment substantially extends in the second direction;
the first polyline segment is farther away from the second trace group than the third polyline segment; the first polyline segment is electrically connected to a corresponding fan-out trace, and the third polyline segment is electrically connected to the test circuit; and
a first polyline portion in the first connection line cluster at least partially surrounds a first polyline portion in the second connection line cluster.

11. The display panel according to claim 9, wherein in the direction directed from the first trace group to the second trace group in the second direction, linear lengths of first polyline portions of the first connection lines in the first connection line cluster and first polyline portions of the first connection lines in the second connection line cluster gradually decrease, a linear length of the first polyline portion being a sum of linear distances between two ends of each segment of the first polyline portion; and/or
in the direction directed from the first trace group to the second trace group in the second direction, linear lengths of third curved portions of the first connection lines in the first connection line cluster gradually decrease.

12. The display panel according to claim 9, wherein the fifth sub-bundle further includes a third connection line cluster and a fourth connection line cluster that are disposed in parallel in the second direction, and the third connection line cluster is farther away from the second trace group than the fourth connection line cluster; the third connection line cluster and the fourth connection line cluster are closer to the second trace group than the first connection line cluster and the second connection line cluster;
the polyline portion further includes a second polyline portion, first connection lines in the third connection line cluster and first connection lines in the fourth connection line cluster each have the second polyline portion; and
the first connection lines in the third connection line cluster each further have the third curved portion.

13. The display panel according to claim 12, wherein the display panel further comprises a test circuit disposed on the side of the second fan-out region away from the bending region, and the second polyline portion is located on a side of the test circuit proximate to the second fan-out region;
the second polyline portion includes a fourth polyline segment and a fifth polyline segment that are connected in sequence, the fourth polyline segment substantially extends in the first direction, and the fifth polyline segment substantially extends in the second direction;
the fourth polyline segment is electrically connected to a corresponding fan-out trace in the plurality of fan-out traces, and the fifth polyline segment is electrically connected to the test circuit; and
a second polyline portion in the third connection line cluster at least partially surrounds a second polyline portion in the fourth connection line cluster.

14. The display panel according to claim 12, wherein in the direction directed from the first trace group to the second trace group in the second direction, linear lengths of second polyline portions of the first connection lines in the third connection line cluster and second polyline portions of the first connection lines in the fourth connection line cluster gradually decrease, a linear length of the second polyline portion being a sum of linear distances between two ends of each segment of the second polyline portion; and/or
in the direction directed from the first trace group to the second trace group in the second direction, linear lengths of third curved portions of the first connection lines in the third connection line cluster gradually decrease; and/or
in the direction directed from the first trace group to the second trace group in the second direction, extension lengths of first connection lines in the first connection line cluster, the second connection line cluster, the third connection line cluster and the fourth connection line cluster gradually decrease.

15. The display panel according to claim 8, wherein in the plurality of first connection lines, first connection lines that are connected to fan-out traces in the fourth sub-bundle constitute a sixth sub-bundle, and an extension length of each first connection line in the sixth sub-bundle is substantially equal to a linear length thereof.

16. The display panel according to claim 1, wherein in a direction directed from the first trace group to the second trace group in the second direction, linear lengths of fan-out traces in a first trace bundle in two adjacent first trace bundles gradually decrease;
at least one fan-out trace in a first trace bundle that is farther away from the second trace group in the two adjacent first trace bundles has a curved portion; and in the first trace bundle, the fan-out trace having the curved portion is closer to the second trace group than other fan-out traces.

17. The display panel according to claim 1, wherein the second trace group includes a plurality of second trace bundles disposed in parallel in the second direction;
in a direction directed from the second trace group to the first trace group in the second direction, linear lengths of fan-out traces in a second trace bundle in two adjacent second trace bundles gradually decrease;

at least one fan-out trace in a second trace bundle that is farther away from the first trace group in the two adjacent second trace bundles has a curved portion; and in the second trace bundle, the fan-out trace having the curved portion is closer to the first trace group than other fan-out traces.

18. The display panel according to claim 1, wherein the display panel further has a second fan-out region located on a side of the bending region away from the first fan-out region; the display panel further comprises:
- a plurality of first connection lines disposed at least in the second fan-out region, wherein the plurality of first connection lines extend from a side of the second fan-out region proximate to the bending region to a side of the second fan-out region away from the bending region; and
- a plurality of second connection lines disposed in the bending region, wherein the plurality of second connection lines extend from a side of the bending region proximate to the first fan-out region to a side of the bending region proximate to the second fan-out region;

wherein the fan-out trace, a second connection line in the plurality of second connection lines and a first connection line in the plurality of first connection lines are electrically connected in sequence.

19. A display apparatus, comprising:
a first display panel, wherein the first display panel is the display panel according to claim 1.

20. The display apparatus according to claim 19, further comprising:
a second display panel; and
a rotating shaft disposed on a back side of the second display panel, the second display panel being able to be folded along the rotating shaft;
wherein the first display panel is disposed on the back side of the second display panel, and is located on a side of the rotating shaft; a light-emitting direction of the first display panel and a light-emitting direction of the second display panel are opposite to each other.

* * * * *